(12) United States Patent
Huang et al.

(10) Patent No.: US 6,782,021 B2
(45) Date of Patent: Aug. 24, 2004

(54) QUANTUM DOT VERTICAL CAVITY SURFACE EMITTING LASER

(76) Inventors: Xiaodong Huang, 401 W. Pine Ave. #79, Lompoc, CA (US) 93436; Andreas Stintz, 4704 Hannett Avenue, NE., Albuquerque, NM (US) 87110; Kevin Malloy, 7224 General Kearny Ct. NE., Albuquerque, NM (US) 87109-6304; Guangtian Liu, 5100 Patrick Henry Dr., Santa Clara, CA (US) 95054; Luke Lester, 8409 Manuel Cia Pl. NE., Albuquerque, NM (US) 87122; Julian Cheng, 1463 Montego Dr., San Jose, CA (US) 95120

(*) Notice: Subject to any disclaimer, the term of this patent is extended or adjusted under 35 U.S.C. 154(b) by 143 days.

(21) Appl. No.: 10/087,408

(22) Filed: Mar. 1, 2002

(65) Prior Publication Data

US 2002/0176474 A1 Nov. 28, 2002

Related U.S. Application Data

(60) Provisional application No. 60/276,186, filed on Mar. 16, 2001, provisional application No. 60/272,307, filed on Mar. 2, 2001, and provisional application No. 60/316,305, filed on Aug. 31, 2001.

(51) Int. Cl.[7] .............................. H01S 5/34; H01L 29/06
(52) U.S. Cl. ............................. 372/45; 257/14; 372/96
(58) Field of Search ..................................... 372/45, 96

(56) References Cited

U.S. PATENT DOCUMENTS

| 5,541,949 A | 7/1996 | Bhat et al. |
| 5,543,354 A | 8/1996 | Richard et al. |
| 5,557,627 A | 9/1996 | Schneider, Jr. et al. |
| 5,614,435 A | 3/1997 | Petroff et al. ............... 437/110 |
| 5,710,436 A | 1/1998 | Tanamoto et al. |
| 5,714,765 A | 2/1998 | Noetzel et al. |
| 5,781,575 A | 7/1998 | Nilsson |
| 5,817,538 A | 10/1998 | Mukai et al. .................. 438/41 |
| 5,881,086 A | 3/1999 | Miyazawa |
| 5,930,278 A | 7/1999 | Menigaux |
| 5,953,356 A | 9/1999 | Botez et al. |
| 6,052,400 A | 4/2000 | Nanbu et al. .................. 372/50 |
| 6,117,699 A | 9/2000 | Lemoff et al. |
| 6,177,684 B1 | 1/2001 | Sugiyama |
| 6,285,704 B1 | 9/2001 | Kullander-Sjoberg et al. |
| 6,329,668 B1 | 9/2001 | Kullander-Sjoberg et al. |
| 6,366,597 B1 * | 4/2002 | Yuen et al. .................... 372/96 |
| 2001/0050934 A1 | 12/2001 | Choquette et al. |

OTHER PUBLICATIONS

Asryan, L.V.; and Suris, R.A.; *Charge Neutrality Violation In Quantum–Dot Lasers*; IEEE Journal Of Selected Topics in Quantum Electronics; vol. 3, No. 2; Apr. 1997; pp. 148–157.

Bimberg, D.; Kirstaedter, N.; Ledenstov, N.N.; Alferov, Zh.I.; Kop'ev, P.S.; and Ustinov; V.M.; *InGaAs–GaAs Quantum Dot Lasers*; IEEE Journal Of Selected Topics in Quantum Electronics, vol. 3, No. 2; Apr. 1997; pp. 196–205.

Bossert, D.J.; and Gallant, D.; *Improved Method for Gain/Index Measurements Of Semiconductor Lasers*; Electronics Letters; vol. 32, No. 4; Feb. 15, 1996; pp. 338–339.

(List continued on next page.)

Primary Examiner—James W. Davie
(74) Attorney, Agent, or Firm—Fenwick & West LLP

(57) ABSTRACT

A quantum dot vertical cavity surface-emitting laser has a low threshold gain. Top and bottom mirrors have a low mirror loss, with at least one of the mirrors being laterally oxidized to form semiconductor/oxide mirror pairs. In one embodiment, mode control layers reduce the optical field intensity in contact layers, reducing optical absorption. In one embodiment, delamination features are included to inhibit the tendency of laterally oxidized mirrors from delaminating.

26 Claims, 13 Drawing Sheets

OTHER PUBLICATIONS

Bossert, David J.; amd Gallant, David; Gain, Refractive Index, And α–Parameter In InGaAs–GaAs SQW Broad–Area LAsers; IEEE Photonics Technology Letters, vol. 8, No. 3; Mar. 1996; pp. 322–324.

Brandt, O.; Ploog, K.; and Tapfer, L.; *Formation And Morphology Of InAs/GaAs Heterointerfaces*; Physical Review; vol. 45, No. 15; Apr. 15, 1992; pp. 8443–8452.

Brault, J.; Gendry, M.; Grenet, G.; and Hollinger, G.; *Role Of Buffer Surface Morphology And Alloying Effects On The Properties Of InAs Nanostructures Grown On InP(001)*; Applied Physics Letters; vol. 73, No. 20; Nov. 16, 1998; pp. 2932–2934.

Brault, J.; Gendry, M.; Marty, O.; Pitaval, M.; Olivares; J.; Grenet , G.; and Hollinger, G.; *Staggered Vertical Self–Organization Of Stacked InAs/InA1As Quantum Wires On INP(001)*; Applied Surface Science; vol. 162–163; Aug. 2000; pp. 584–589.

Choo, Heung Ro; O, Beom–hoan; Park, Chong Dae; Kim, Hyung Mun; Kim, Jeong Soo; Oh, Dae Kon; Kim, Hong Man; and Pyun, Kwang Eui; *Improvement Of Linewidth Enhancement Factor In 1.55 µm Multiple–Quantum–Well Laser Diodes*; IEEE Photonics Technology Letters; vol. 10, No. 5; May 1998; pp. 645–647.

Chou, S.T.; Hsieh, K.C.; Cheng, K.Y.; and Chou, L.J.; *Growth Of $Fa_xIn_{1-x}As$ Quantum Wire Heterostructures By The Strain–Induced Lateral–Layer Ordering Process*; J. Vac. Sci. Technol. B.; vol. 13, No. 2; Mar/Apr 195; pp. 650–652.

Chyi, Jen–Inn; Nee, Tzer–En; Lee, Ching–Ting; Shieh, Jia–Lin; and Pan, Jen–Wei; ; *Formation Of Self Organized $In_{0.5}Ga_{0.5}As$ Quantum Dosts On Ga As By Molecular Beam Epitaxy*; Journal Of Crystal Growth; vol. 175, 176; 1997; pp. 777–781.

Dutta, N.K.; Hobson, W.S.; Vakhshoori, D.; Han, H.; Freeman, P.N.; de Jong, J.F.; and Lopata, J.; *Strain Compensated InGaAs–GaAsP–GaP Laser*; IEEE Photonics Technology Letters; vol. 8, No. 7: Jul. 1996; pp. 852–854.

Eliseev, P.G.: Li, H.; Liu, G.T.; Stintz, A.; Newell, T.C.; Lester, L.F.; and Malloy, K.J.; *Gain In Ultra–Low–Threshold InAs/InGaAs Quantum Dot Lasers*; Conference; 2000 IEEE 17th International Semiconductor Laser Conference; Sep. 25–28, 2000; pp. 65–66.

Eliseev, P.G.; Li. H.; Liu, G.T.; Stintz, Andreas; Newell, T.C.; Lester, L.F.; and Malloy, K.J.; *Ground–State Emission And Gain in Ultralow–Threshold InAs–InGaAs Quantum–Dot Lasers*; IEEE Journal On Selected Topics In Quantum Electronics; vol. 7, No. 2; Mar./Apr. 2001; pp. 135–142.

Eliseev, P.G.; Li, H.: Liu, G.T.; Stintz, A.; Newell, T.C.; Lester, L.F.; and Malloy, K.J.; Optical Gain In InAs/inGaAs Quantum–Dot Structures; Experiments And Theoretical Model; Quantum ELectronics 30(8); 2000; pp. 664–668.

Eliseev, P.G.; Li, H.; Stintz, A.; Liu, G.T.; Newell, T.C.; Malloy, K.J.; and Lester, L.F. ; *Transition Dipole Moment Of InAs/InGaAs Quantum Dots From Experiments On Ultralow–Threshold Laser Diodes*; Applied Physics Letters; vol. 77, No. 2; Jul. 10, 2000; pp. 262–264.

Eliseev, P.G.; Li, H.; Stintz, A.; Liu, G.T.; Newell, T.C.; Malloy, K.J.; and Lester, L.F.; *Tunable Grating–Coupled Laser OScillation And Spectral Hole Burning In An InAs Quantum–Dot Laser Diode*; IEEE Journal Of Quantum Electronics; vol. 36, No. 4; Apr. 2000; pp. 479–485.

Fiore, A; Borri; P.; Langbein, W.; Hvam, J.M.; Oesterie, U.; Houdre, R.; and Ilegems, M.; *Time–Resolved Characterization Of InAs/InGaAs Quantum Dot Gain Material For 1.3 βm Lasers On Gallium Arsenide*; CLEO 2000 Conference; May 2000; p. 348.

Gingrich, H.S.; Chumney, D.R.; Sun, S.–Z.; Hersee, S.D.; Lester, L.F.; and Brueck, S.R.J.; *Broadly Tunable External Cavity Laser Diodes With Staggered Thickness Multiple Quantum Wells*; IEEE Photonics Technology Letters; vol. 9, No. 2; Feb. 1997; pp. 155–157.

Gonzalez, L.; Garcia, J.M. ; Garcia, R.; Briones; F.; Martinez–Pastor, J.; and Ballesteros, C.; *Influence Of Buffer–Layer Surface Morphology On The Self–Organized Growth Of InAs On InP(001) Nanostructures*; Applied Physics Letters; vol. 76, No. 9; Feb.28, 2000; pp. 1104–1106.

Grundman, M.; and Bimberg, D.; *Theory Of Random Population For Quantum Dots*; Physical Review B; vol. 55, No. 15; Apr. 15, 1997; pp. 9740–9745.

Guo, S.P.; Ohno, H.; Shen, A.; Matsukura, F.; amd Ohno, Y.; *InAs Self–Organized Quantum Dashes Grown On GaAs (211)B*; Appl. Phys. Letters, vol. 70, No. 20; May 19, 1997;pp. 2738–2740.

Hakki, Basil W.; and Paoli, Thomas L.; *Gain Spectra in GaAs Double–Heterostructure Injection Lasers*; Journal Of Applied Physics, vol. 46, No. 3; Mar. 1975; pp. 1299–1306.

Hinzer, K.; Fafard, S.; SpringThorpe, A.J.; Arlett, J.; Griswold, E.M.; Feng, , Y.; and Charbonneau, S.; *Room Temperature Operation Of AlInAs/A1GaAs Quantum Dot Lasers*; Physica E. vol. 2; 1998; pp. 729–733.

Huang, X.; Stingz, A.; Hains, C.P.; Cheng, J.; and Malloy, K.J.; Efficient High–Temperature CW Operation Of Oxide Confined Long–Wavelength InAs/A1GaAs Quantum Dot Lasers; CLEO 2000 Conference; May 2000; pp. 348–349.

Huang, Xiaodong; Stintz, A.; Hains, C.P.; Liu, G.T.; Cheng, J.; and Malloy, K.J.; *Efficient High–Temperature CW Lasing Operation Of Oxide–Confined Long–Wavelength InAs Quantum Dot Lasers*; Electronics Letters; vol. 36, No. 1; Jan. 6, 2000.

Huang, Xiaodong; Stintz, A.; Hains, C.P.; Liu, G.T.; Cheng, Julian; and Malloy, K.J.; *Very Low Threshold Current Density Room Temperature Continuous–Wave Lasing From A Single–Layer InAs Quantum–Dot Laser*, IEEE Photonics Technology Letters, vol. 12, No. 3; Mar. 2000; pp. 227–229.

Huang, Xiaodong; Stintz , A.; Hua, Li; Lester, L.F.; Cheng, Julian; and Malloy, K.J.; *Demonstration of Passive Q–Switching And Passive Mode –Locking in 1.3βm . Two section InAs Quantum Dot Lasers*; Conference; CLEO 2001; May 2001; p. 359.

Huffaker, D.L.; and Deppe, D.G.; *Electroluminescence Efficiency of 1.3 βm Wavelength InGaAs/GaAs Quantum Dots*; Applied Physics Letters; vol. 73, No. 4; Jul. 27, 1998; pp. 520–522.

Kaspi, R.; and Evans, K.R.; *Improved Compositional Abruptness At The InGaAs On GaAs Interface By Presaturation With In During Molecular–Beam Epitaxy*, Appl. Phys. Lett.; vol. 67, No. 6; Aug. 7, 1995; pp. 819–821.

Kirstaedter N.; Ledenstov, N.N.; Grundmann, M.; Bimberg, D.; Ustinov, V.M.; Ruvimov, S.S.; Maximov, M.V.; Kop'ev, P.S.; Alferov, Zh.I.; Richter, U.; Werner, P.; Gosele, U.; and Heydenreich, J.; *Low Threshold, Large To Injection Laser Emission From (InGa) As Quantum Dots*; Electronics Lettes, vol. 30, No. 17; Aug. 18, 1994; pp. 1416–1417.

Lester, Luke F.; *Materials Growth And Device Characterization Of InAs Quantum Dot Lasers*; Conference; LEOS; Nov. 15, 2000.

Lester, L.F.; Stintz, A.; Lu, H.; Newell, T.C.; Pease, E.A.; Fuchs, B.A.; and Malloy, K.J.; *Optical Characteristics Of 1.24–μm InAs Quantum–Dot Laser Diodes*; IEEE Photonics TEchnology Letters, vol. 11, No. 8, Aug. 1999; pp. 931–933.

Li, H.; Liu, G.T; Varanagis, P.M.; Newell, T.C.; Stintz, A.; Fuchs, B.; Malloy, K.J.; and Lester, L.F.; 150–nm Tuning Range In A Grating–Coupled External Cavity Quantum–Dot Laser; 2000 CLEO Europe Conference; Sep. 2000.

Li, H.; Liu, G.T.; Varangis, P.M.; Newell, T.C.; Stintz, A.; Fuchs, B.; Malloy, K.J.; and Lester, L.F.; *150–nm Tuning Range In A Grating–Coupled External Cavity Quantum–Dot Laser*, IEEE Photonics Technology Letters, vol. 12, No. 7, Jul. 2000; pp. 759–761.

Li, H.; Newell, T.C.; Liu, G.T.; Stintz, A.; Malloy, K.; and Lester, L.F.; *Carrier Lifetime And Radiatice Recombination In Quantum Dot LEDS*; IEEE 2000 LEOS Annual Meeting; Nov. 2000; pp. 376–377.

Li, Y.F.; Lin, F.; Xu, B.; Liu, R.Q.; Ye, X.L.; Ding D.; and Wang Z.G.; *Influence OF Growth Conditions On Self–Assembled InAs Nanostructures Grown On (001)inP Substrate By Molecular Beam Epitaxy*, Journal of Crystal Growth; vol. 223; 2001; pp. 518–522.

Li, Y.F.; Ye, X.L.; Xu, B.; Liu, F.Q.; Ding, D.; Jiang, W.H.; Sun, Z.Z.; Zhang, Y.C.; Liu, H.Y.; and Wang, Z.G.; *Room Temperature 1.55 μm Emission From InAs Quantum Dots Grown On (001)InP Substrate By Molecular Beam Epitaxy*; Journal Of Crystal Growth; vol. 218, 2000; pp. 451–454.

Li, Yue–Fa; Liu, Feng–Qi; Xu, Bo; Lin, Feng; Wu, Ju; Jiang, Wei–Hong; Ding, Ding; and Wang, Zhan–Guo; InAs Self–Assembled Nanstructures Grown On InP(001); Chinese Physics; vol. 9, No. 3; Mar. 2000; pp. 222–224.

Lian, G.D.; Yuan, J.; brown , L.M.; Kim, G.H.; and Ritchie, D.A.; Modification Of InAs Quantum Dot Structure By The Growth OF the Capping Layer, Applied Physics Letters; vol. 73, No. 1; Jul. 6, 1998; pp. 49–51.

Liu, G.T.; Li, H.; Stintz, A.; Newell, T.C.; Lester, L.f.; and Malloy, K.J.; Modal Gain and To Value Improvements In Quantum Dot Lasers Using Dots–In–A–Well (DWELL) Structure; IEEE 2000 International Semiconductor LAser Conference; pp. 133–134.

Liu, G.T.; Stintz, A.; Li, H.; Lester, L.F.; and Malloy, L.F.; *Ultra–Low Threshold Current Density Quantum Dot Lasers Using The Dots–In–A–Well (DWELL) Structure; Conference: Physics And Simulation Of Optoelectronic Devices—Conference 8th*, Proceedings –SPIE The International Society For Optical Engineering ; vol. 3944; 2000; pp. 814–822.

Liu, G.T.; Stintz, A.; Li, H.; Malloy,K.J.; and Lester, L.F.; *Extremely Low Room–Temperature Threshold Current Density Diode Lasers Using InAs Dots In $In_{0.15}Ga_{0.85}As$ Quantum Well*, Electronics Letters; vol. 35, No. 14; Jul. 8, 1999.

Liu, G.T.; Stintz, A.; Li, H; Malloy, K.J.; and Lester, L.F.; *1.25 μm Low Threshold Current Density Dots In–A–Well (DWELL) Lasers*; Conference; 1999 Digest Of The LEOS Summer Topical Meetings; Nanostructures And Quantum Dots/WDM Components/VCSELS And Microvaties/RF Photonics For CATV ANd HFC Systems; Jul. 26–30, 1999.

Liu, G.T.; Stintz, A.; Li, H.; Newell, T.C.; Gray, A.L.; Varangis, P.M.; Malloy, K.J.; and Lester,L.F.; *The Influence Of Quantum–Well Composition On the Performance Of Quantum Dot Lasers Using InAs/InGaAs Dots–In–A–Well (DWELL) Structures*; IEEE Journal Of Quantum Electronics, vol. 36, No. 11, Nov. 2000; pp. 1272–1279.

Liu, G. T.; Stintz, A.; Li, H.; Newell, T.C.; Varangis, P.; Malloy, K.J.; and Lester, L.F.; *One And Three–Stack Quantum Dot Lasers With Very Low Threshold Current Density*; Conference: Conference On Lasers And Electo–Optics (CLEO 2000); 2000; May 2000; pp. 346–347.

Liu, Guangtian; *Characteristics Of Ultralow Threshold Quantum–Dot Lasers Using InAs/InGaAsDots–In–A–Well Structures*; Thesis (Ph.D.); University of New Mexico; Dept. of Electrical And Computer Engineering; Dec. 2000; pp. 1–120.

Liu, Guangtian; *Very Low Room–Temperature Threshold Current Density Dots In a Well (DWELL) Lasers*; Conference: 1999 IEEE LEOS Annual Meeting Conference Proceedings. LEOS '99; 12 Annual Meeting; IEEE Lasers And Electro–Optics Society; Nov. 1999; vol. 2; pp. 469–470.

Lott, J.A.; Ledentsov, N.N.; Ustimov, V.M.; Maleev, N.A., Zhukov, A.E.; Kovsh, A.R.; Maximov, M.V.;Volovik, B.V.; Alferov, Zh.I.; and Bimberg, D.; InAs–InGaAs Quantum Dot VCSELs On GaAs Substrates Emitting At 1.3μ; Electronics Letters; vol. 36, No. 16; Aug. 3, 2000.

Marciante, John R.; and Agrawal, Govind P.; *Spatio–Temporal Characteristics Of Filamentation in Broad–Area Semiconductor Lasers*; IEEE Journal OF Quantum Electronics , vol. 33, No. 7; Jul. 1997; pp. 1174–1179.

Maximov, Mikhail V.; Kochnev, Igor V.; Shernyakov, Yuri M.; Zaitsev, Sergei V.; Gordeev, Nikita Yu.; Tsatsul'nikov, Andrew F.; Sakharov, Alexey V.; Krestnikov, Igor L.;Kop'ev, Petr S.; Alferov, Zhores I.; Ledentsov, Nikolal N.; Bimberg, Dieter; Kosogov, Alexander O.; Werner, Peter, and Gosele, Ulrich; Ledentsov, Nikolai N.; Bimberg, Dieter; Kosogov, Alexander O.; Werner, Peter; and Gosele, Ulrich; *InGaAs/GaAs Quantum Dot Lasers With Ultrahigh Characteristic Temperature($T_0$=385K) Grown By Metal Organic Chemical Vapour Deposition*; Jpn. J. Appl. Phys.; vol. 36, Pt 1, No. 6B; 1997; pp. 4221–4223.

Bloch, J. et al., "Room–temperature 1.3 μm emission from InAs quantum dots grown by metal organic chemical vapor deposition ," *Applied Physics Letters*, American Institute of Physics, New York, U.S., vol. 75, No. 15, Oct. 11, 1989, pp. 2199–2201.

Evans, P.W. et al., "Edge–emitting quantum well heterostructures laser diodes with auxiliary native–oxide vertical cavity confinement," *Applied Physics Letters*, American Institute of Physics, New York , U.S., vol. 67, No. 21, Nov. 20, 1995, pp. 3168–3170.

Garcia, J.M. et al.; "Electronic styates tuning of InAs self–assembled quantum dots," *Applied Physics Letters*, American Institute of Physics, New York, U.S., vol. 72, No. 24, Jun. 15, 1998, pp. 3172–3174.

Kim, Jin K. et al., "Lateral Carrier Confinement in Miniature Lasers Using Quantum Dots," *IEEE Journal of Selected Topics in Quantum Electronics*, IEEE Service Center, U.S., vol. 6, No. 3, May/Jun. 2000, pp. 504–510.

Ledentsov N.N. et al., "Interconnection between gain spectrum and cavity mode in a quantum–dot vertical–cavity laser," *Semiconductor Science and Technology*, Institute of Physics, London, G.B., vol. 14, No. 1, 1999, pp. 99–102.

* cited by examiner

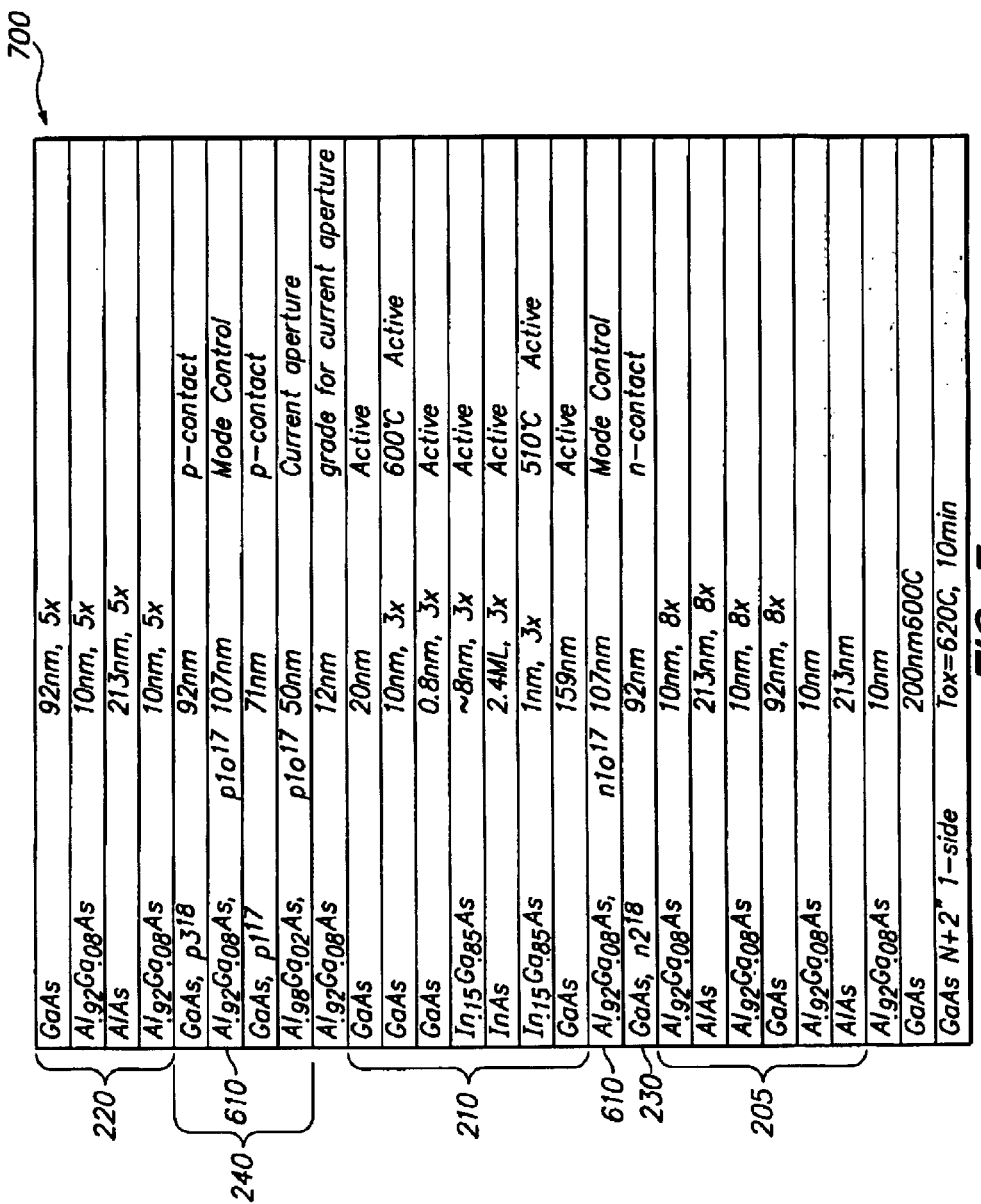

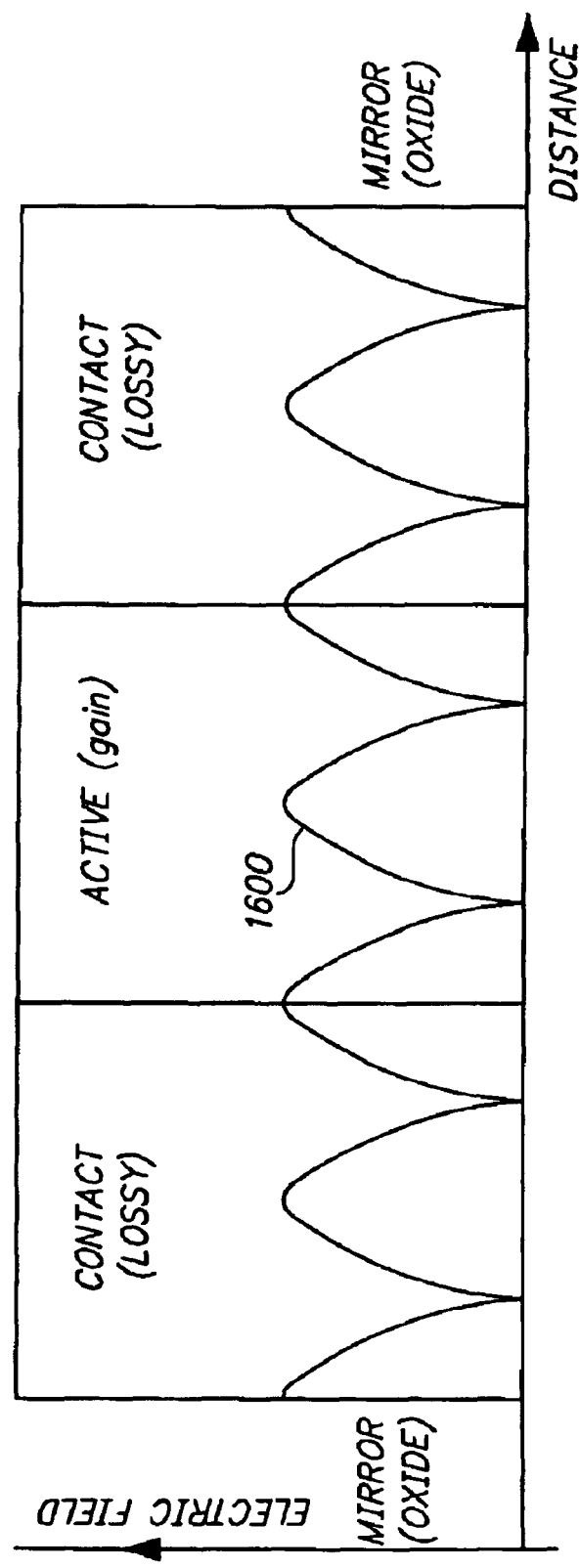

QUANTUM DOT VERTICAL CAVITY SURFACE EMITTING LASER

RELATED APPLICATIONS

This application claims priority under 35 U.S.C.§ 119(e) to the following U.S. Patent Application Nos.: 60/276,186, entitled "Semiconductor Quantum Dot Laser Active Regions Based On Quantum Dots in a Optimized Strained Quantum Well," filed Mar. 16, 2001; 60/272,307, entitled "Techniques for Using Quantum Dot Active Regions In Vertical Cavity Surface Emitting Lasers," filed Mar. 2, 2001; 60/316,305, entitled "Quantum Dot And Quantum Dash Active Region Devices," filed Aug. 31, 2001. The contents of all of the above applications are hereby each incorporated by reference in their entirety in the present patent application.

This application is also related to U.S. patent application Ser. No. 09/972,303 "Quantum Dot Lasers," on Oct. 5, 2001, commonly owned by the assignee of the present patent application, the contents of which are hereby incorporated by reference in their entirety.

STATEMENT AS TO FEDERALLY SPONSORED RESEARCH AND DEVELOPMENT

The U.S. Government may have certain rights in this invention pursuant to research conducted under the following grants: Grant No. F49620-95-1-0530 awarded by the Air Force Office Of Science and Research, Grant No. DAAL01-96-02-0001 awarded by the Army Research Lab, Grant No. F4920-99-1-330 awarded by the Air Force Office of Science and Research, and Grant No. MDA972-98-1-0002 awarded by the Defense Advanced Research Projects Agency.

BACKGROUND OF THE INVENTION

1. Field of the Invention

The present invention relates generally to self-assembled semiconductor quantum dot lasers. More particularly, the present invention is directed towards quantum dot vertical cavity surface emitting lasers (QD-VCSELs).

2. Description of Background Art

Vertical cavity surface emitting lasers (VCSELs) are of interest for a variety of applications. Some of the advantages of a conventional VCSEL include surface emission, a nearly round emission pattern, a low threshold current, and the potential for high-yield, low cost manufacturing and packaging.

FIG. 1 illustrates some of the features of a conventional VCSEL 100. A bottom mirror 105 is disposed on a substrate 102. An active region 110 is disposed between the bottom mirror 105 and a top mirror 120. A conventional VCSEL typically includes a quantum well active region for providing optical gain. A quantum well active region typically includes one or more quantum wells capable of providing a comparatively high optical gain. Optical feedback is typically provided by top and bottom distributed bragg reflector (DBR) mirror structures. In a DBR mirror VCSEL, the mirrors typically comprise pairs of alternating high index and low index semiconductor layers, with each layer typically being approximately a quarter wavelength in optical thickness. The active region is typically a high index region approximately an integer number of half wavelengths in thickness having a gain region disposed in its center.

Quantum dot (QD) VCSELs are of potential interest for a variety of applications. Each quantum dot consists of an island of low bandgap material surrounded on all sides by a higher bandgap material. The low bandgap island of each quantum dot is sufficiently small that each dimension (length, width, and height) is smaller than the thermal deBroglie wavelength over operating temperatures of interest. As a consequence, the quantum dot has its energy states quantum confined in three dimensions, resulting in a delta-like density of states (e.g., a high density of states in a finite energy band around each permissible optical transition, analogous to a density of states for atoms).

Quantum dot active regions have a variety of characteristics that make them of interest for VCSELs, such as potential advantages in regards to temperature sensitivity and high-speed modulation. However, there are several technical barriers that have hindered the commercial exploitation of QD-VCSELs.

One barrier to the commercial exploitation of QD-VCSELs is that conventional quantum dot active regions typically have a peak optical gain that is low compared with quantum wells due to the small fill factor of quantum dots. Moreover, the optical gain at the ground state energy level saturates in quantum dots. The optical gain available from a layer of quantum dots is typically about an order of magnitude lower than that which can be achieved from a quantum well. For example, in edge-emitting lasers, the maximum ground state gain that can be achieved from a single layer of quantum dots is typically in the range of about 5 to 10 $cm^{-1}$.

Another barrier to the commercial use of QD-VCSELs is that many commercial applications have demanding operational requirements. For example, some applications, such as ten-gigabit Ethernet (10-GigE) require that the VCSEL operate in an uncooled transceiver over an extended temperature range (e.g., up to about 85° C.), operate at a nominal wavelength of about 1310 nanometers (nm), and have sufficient differential gain over all operating conditions to be modulated at the desired data rate. However, since the maximum ground state optical gain decreases with increasing operating temperature this requirement further exacerbates the difficulty of designing a QD-VCSEL having sufficient optical gain to operate within ambient temperature ranges of commercial interest.

What is desired is a QD-VCSEL with improved manufacturability and desirable performance characteristics.

SUMMARY OF THE INVENTION

A quantum dot vertical cavity surface emitting laser has a low cavity loss and a correspondingly low threshold gain. To begin with, at least one of the mirrors of the laser cavity is an ultrahigh reflectivity distributed bragg reflector (DBR) mirror with mirror pairs comprised of alternating layers of high refractive index semiconductor and low refractive index oxide.

Doped intracavity contact layers between the DBR mirrors provide current to a quantum dot active region. In a preferred embodiment, the contact layers have a thickness of about a half a wavelength or less to reduce free carrier loss. In one embodiment, about a quarter of a wavelength or less of each contact layer is heavily doped. The heavily doped portions of the contact layer may be positioned to have a low optical overlap with the longitudinal mode to reduce the free carrier loss.

In one embodiment, additional mode control layers are disposed between the DBR mirrors and the active region to reduce the optical overlap of the mode in doped regions and increase the optical confinement in the active region. In a preferred embodiment, the mode control layers are approximately quarter wavelength thick regions, have a refractive index different than adjacent layers, and are positioned to produce resonant reflections that beneficially increase the optical confinement of the longitudinal optical mode in the quantum dot active region and reduce optical confinement in heavily doped contact regions.

In one embodiment, each ultrahigh reflectivity DBR mirror is formed using a lateral oxidation process to convert oxidizable semiconductor layers into low refractive index oxides. In one embodiment, delamination of laterally oxidized mirror layers is inhibited by including intermediate composition layers to reduce residual stress. In another embodiment, one or more openings is arranged to permit lateral oxidation of bottom mirror regions while preserving lateral support regions to support the bottom mirror layers.

BRIEF DESCRIPTION OF THE DRAWINGS

FIG. 7 shows a sequence of epitaxially grown layers for one embodiment of a VCSEL for producing light with a wavelength around about 1300 nanometers.

FIG. 16A is an illustrative graph of longitudinal mode intensity in a VCSEL without mode control layers.

DETAILED DESCRIPTION OF THE PREFERRED EMBODIMENTS

The present invention is directed towards quantum dot vertical cavity surface emitting lasers (QD-VCSELs) having a low cavity loss and a correspondingly low threshold gain. One application of the VCSELs of the present invention is for high data rate communication systems with an emission wavelength greater than about 1290 nanometers (nm) in which the VCSEL must lase over an extended range of ambient temperatures (e.g., 0° C. to 85° C.). However, it will be understood that the VCSELs of the present invention may be utilized in a variety of applications.

Figure 1:
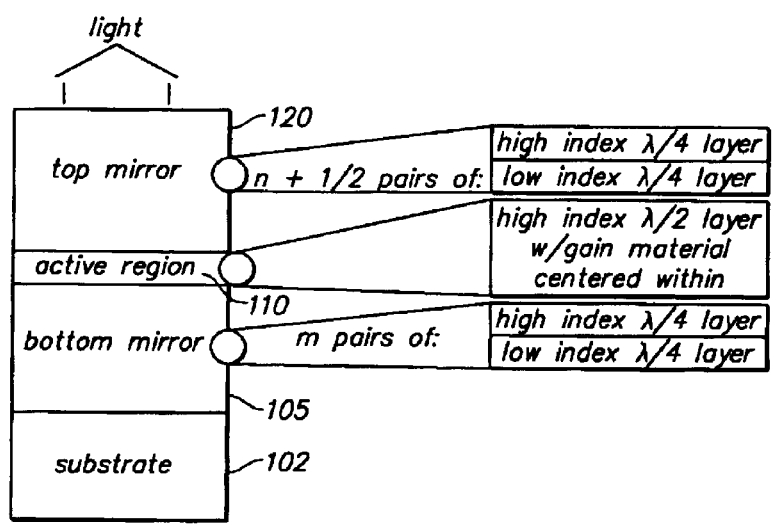
FIG. 1 illustrates a prior art vertical cavity surface emitting laser design.
Figure 2A:
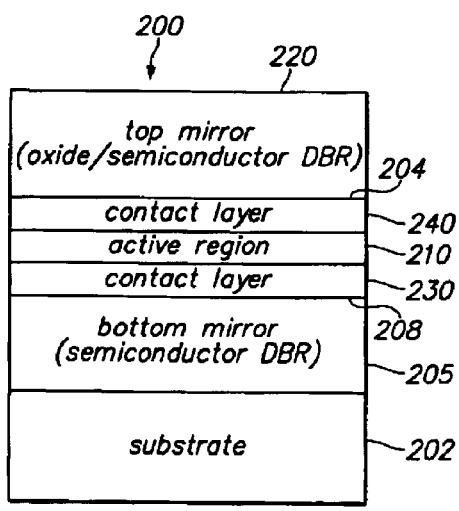
FIGS. 2A, 2B, and 2b illustrate vertical cavity surface emitting lasers in accord with embodiments of the present invention.
Figure 2B:
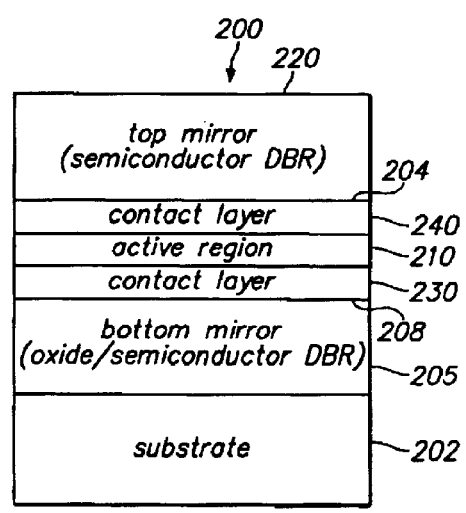
Figure 2C:
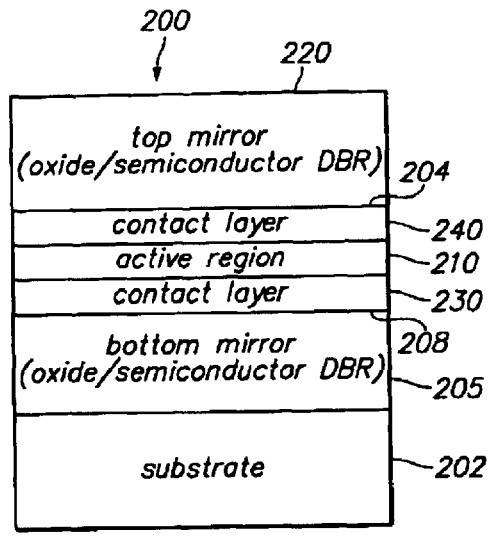

Referring to FIGS. 2A, 2B, and 2C, a QD-VCSEL 200 of the present invention has a quantum dot active region 210 disposed between a bottom surface 204 of a top mirror 220 and a top surface 208 of a bottom mirror 205. A so-called "microcavity," a laser cavity having an extremely short effective cavity length, is formed in the region between the two mirrors 205 and 220. Each mirror 205 and 220 is a distributed bragg reflector (DBR) mirror with a $\lambda/2$ refractive index variation associated with a sequence of mirror pairs, where $\lambda$ is the emission wavelength of laser light inside the laser cavity. As used hereinafter, it will be understood that layer thicknesses referred to in reference to "$\lambda$" or "wavelength" refers to a desired optical thickness with respect to the wavelength of the laser light within the laser, with the wavelength in the laser being $\lambda=\lambda_0/n_r$, where $\lambda_0$ is the free space wavelength and $n_r$ is the effective refractive index in the laser. It will also be understood that thicknesses referred to in terms of fractions of wavelengths (e.g., $\lambda/4$, $\lambda/2$, $\lambda$) are desired nominal target thicknesses but that some variation in actual thicknesses about the target thicknesses is consistent with the optical physics of operation.

Bottom mirror 205 is disposed on a substrate layer 202. In the processed VCSEL, each mirror has a corresponding top, bottom, and side with respect to a longitudinal optical mode reflected between the two mirrors. As described below in more detail, in a preferred embodiment at least one of the mirrors is a high reflectivity oxide/semiconductor DBR mirror formed by a lateral oxidation process.

Contact layers 240 and 230 have doped regions to permit electron-hole pairs to be injected to the active region 210 responsive to a current. Contact layers 230 and 240 are also known as "intracavity" contact layers because in the processed device they permit current to be provided from contact layers disposed within the optical cavity. A current aperture layer, (e.g., a selectively oxidizable layer that may be oxidized outside of the VCSEL to reduce deleterious currents) is preferably included as part of at least one of the contact layers. In the processed VCSEL, mesa etching may be used to expose the contact layers and suitable metal contact layers deposited to form ohmic contacts to portions of the contact layers.

VCSEL 200 is grown using a suitable epitaxial growth technique for growing self-assembled III–V semiconductor quantum dot active regions, such as molecular beam epitaxy (MBE) or metal-organic vapor phase epitaxy (MOVPE). For a variety of commercial applications the quantum dots may be selected to have a ground state transition energy corresponding to a wavelength in the range of about 1290 nm to 1330 nm or 1480 to 1620 nm. In one embodiment the VCSEL is grown on a GaAs substrate 202 using MBE, the mirrors 205 and 220 are grown as AlGaAs layers having aluminum molar fractions selected to form mirror pairs with a $\lambda/2$ variation in refractive index (e.g., two $\lambda/4$ layers having different refractive indices), and the quantum dot active region 210 comprises one or more quantum dot layers, with each layer of quantum dots being a layer of self-assembled InAs quantum dots embedded in an InGaAs quantum well having GaAs quantum well barriers. More generally, however, active regions utilizing InAs quantum dots may be grown to have ground state emission wavelengths over a range of wavelengths.

In a quantum dot laser, each layer of quantum dots has only a limited maximum gain at the ground state transition energy due to the delta-like density of states function of quantum dots. For self-assembled quantum dots there is also typically a limit on the number of quantum dot layers that can be employed without generating deleterious strain. As a further consideration, the optical gain decreases with increasing active region temperature. Thus, to achieve ground state operation over an extended range of operating temperatures it is necessary to design the VCSEL to have an extremely low threshold gain required for lasing.

The saturated ground state gain depends upon several parameters. Studies by the inventors indicate that a saturated ground state gain of as high as 25 cm$^{-1}$ may be achieved using a quantum dot active region having several InAs quantum dot layers. Thus, it is desirable to have a VCSEL with a threshold gain below about 25 cm$^{-1}$.

The threshold lasing condition for a quantum dot VCSEL similar to that shown in FIG. 2 is given by:

$$\Gamma_{qd}g_{qd} = \Gamma_c\alpha_c + \frac{1}{L_{eff}}\log\left(\frac{1}{R_{eff}}\right) \qquad \text{Eq. 1A}$$

Where $\Gamma_{qd}$ is the optical confinement of the quantum dot layers, $g_{qd}$ is the gain of a quantum dot layer, $\Gamma_c$ is the optical confinement in the contact layers, $\alpha_c$ is the free carrier loss associated with doping the contact layers, $L_{eff}$ is the effective cavity length of a longitudinal mode reflected between the two mirrors, and $R_{eff}$ is the effective mirror reflectivity associated with the top and bottom mirror layers and is conventionally the product of the top and bottom mirror reflectivities. The term $$\frac{1}{L_{eff}}\log\left(\frac{1}{R_{eff}}\right)$$

is also commonly known as the "mirror loss." The mirror reflectivity, active layer thickness, and contact layer thicknesses will also affect the optical confinement of the quantum dot layers and the optical confinement in contact layers.

The ground state transition energy has a saturable gain that is temperature dependent. The saturated gain must be greater than the threshold gain for lasing to occur at the ground state energy level. Thus, Eq. 1 can be rewritten as:

$$\Gamma_{qd}g_{qd-sat} > \Gamma_c\alpha_c + \frac{1}{L_{eff}}\log\left(\frac{1}{R_{eff}}\right) \qquad \text{Eq. 1B}$$

where $g_{qd-sat}$ is the saturated gain.

It can be understood from Eq. 1B that the operable temperature range of a QD-VCSEL is improved by designing a vertical optical structure that simultaneously has a high effective mirror reflectivity, a comparatively high quantum dot confinement factor, and a comparatively low optical confinement in lossy contact regions. Note that for the case of extremely high reflectivity mirrors that the free carrier loss will dominate in Eq. 1B. For the case of ultra high reflectivity mirrors, then, the expression may be approximated as:

$$\Gamma_{qd}g_{qd-sat} > \Gamma_c\alpha_c \qquad \text{Eq. 1C}$$

Low Mirror Loss Design

The magnitude of the reflectivity, R, of a DBR mirror is commonly approximated by:

R=kN$\Delta$n/n, where N is the number of mirror pairs, n is the average index of refraction of the two layers, k is a constant (or a function of $\Delta$n/n), and $\Delta$n is the difference in index of refraction for the two layers. For a semiconductor/semiconductor mirror the refractive index is typically small, such that a large number of mirror pairs are required to achieve a high DBR mirror reflectivity. For example, in the GaAlAs system a GaAs/AlAs mirror pair has a refractive index step of only about 0.6. Consequently, to form an ultra high reflectivity DBR mirror (e.g., a mirror reflectivity of greater than 99.99%) would require growing a large number of mirror pairs, which would result in extremely thick DBR mirrors that would be impractical to grow and process.

The effective reflectivity of the mirrors 205 and 220 is increased if at least one of the mirrors in the processed VCSEL has oxide/semiconductor mirror pairs with a high index step between adjacent mirror layers of each mirror pairs. In accord with one embodiment of the present invention, the epitaxially grown layers of at least one of the mirrors 205 or 220 is grown to have a sequence of mirrors pairs of oxidizable semiconductor layers and substantially nonoxidzable semiconductor layers. The oxidizable semiconductor layer is laterally oxidized in a post-growth process to convert it into a metal oxide having a substantially lower refractive index than the as-grown layer. In the III–V compound semiconductor material system, the oxidation rate increases with increasing aluminum molar fraction. For example, when an AlGaAs layer with an aluminum molar fraction greater than about 0.90 is exposed to steam and nitrogen at a temperature of about 450° C., the arsenic is converted to arsine leaving behind an amorphous mixture of aluminum oxides, gallium oxides, and residual hydrogen. The rate of oxidation is highly dependent upon the aluminum molar fraction, with AlAs oxidizing extremely rapidly. $Al_{0.98}Ga_{0.02}As$ oxidizes about three times faster than $Al_{0.96}Ga_{0.04}As$ and ten times faster than $Al_{0.92}Ga_{0.08}As$.

Metal oxides typically have a low refractive index compared with III–V semiconductors. This permits a post-growth oxidation step to be used to create a DBR mirror having a sequence of oxide and semiconductor layers such that a large refractive index step between mirror pair layers may be achieved, permitting a high DBR mirror reflectivity to be achieved. For example, the as-grown DBR mirror may comprise a sequence of pairs of high/low aluminum composition AlGaAs layers, such as AlAs/AlGaAs or AlAs/GaAs layers. For this case, the refractive index step is increased to about 2.0 by selectively oxidizing the AlAs layer into $AlO_x$ (refractive index of about 1.6) in a post-growth oxidation process. The corresponding reflectivity for a 1.3 micron wavelength emission laser is calculated to be 99.9341% for five DBR mirror pairs and 99.99922% for eight mirror pairs.

As indicated in FIG. 2A, the top-mirror 220 may comprise an oxide/semiconductor DBR mirror whereas the bottom mirror 205 comprises a semiconductor DBR mirror. Alternatively, the bottom mirror 205 may comprise an oxide/semiconductor DBR mirror while the top mirror 220 comprises a semiconductor DBR mirror. Referring to FIG. 2C, it will also be understood that both the top and bottom mirrors 205 and 220 may comprise oxide/semiconductor mirrors.

Oxide/semiconductor DBR mirrors formed by laterally oxidizing high Al composition layers have a tendency to delaminate, particularly if large unsupported areas are completely oxidized. One factor likely to cause delamination is the residual strain at the interface between the oxidized layer and the unoxidized semiconductor. Consequently, in one embodiment of the present invention the semiconductor mirror structure and mirror oxidation process is selected to inhibit mirror delamination during processing and subsequent operation of the VCSEL.

Figure 3:
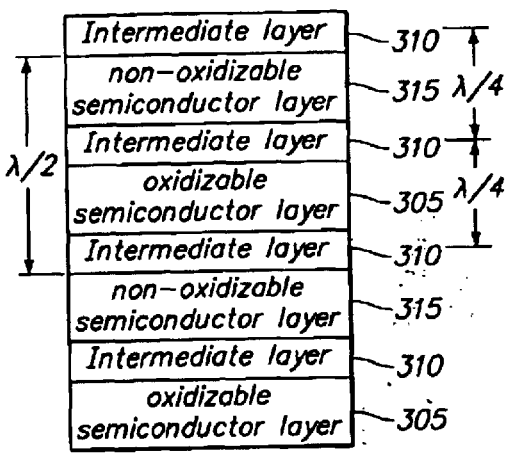
FIG. 3. illustrates one embodiment of a mirror pair for a DBR mirror having laterally oxidizable layers.

FIG. 3 is a diagram illustrating a sequence of grown DBR mirror pair layers (prior to lateral oxidation). In one embodiment, an oxidizable semiconductor layer 305 is connected to a substantially non-oxidizable semiconductor layer 315 by an intermediate layer 310. The composition of the oxidizable semiconductor layer is preferably selected to have a controllable oxidation rate in a lateral oxidation process. Intermediate layer 310 preferably has a composition selected to inhibit delamination of layer 305 from layer 315. The relative thickness of layers 305, 310, and 315 are selected to form DBR mirror pairs with subsequent lateral oxidation of the oxidizable layers.

In one embodiment, the non-oxidizable semiconductor layer 315 comprises a layer of AlGaAs having a first molar fraction of aluminum while the oxidizable layer 305 comprises a layer of AlGaAs having a second, higher molar fraction of aluminum. AlAs oxidizes extremely rapidly. AlGaAs with an aluminum molar fraction below about 0.95 oxidizes comparatively slowly. Consequently, in one embodiment the oxidizable layer has an aluminum molar fraction of between about 0.97 to 0.99, with 0.98 being preferred. For this case, intermediate layer 310 may comprise a region in which the aluminum molar fraction is graded between the aluminum composition of layers 305 and 315 (e.g., $Al_{0.92}Ga_{0.08}As$). The intermediate layer improves adhesion and is believed to reduce mechanical instabilities associated with residual strain at the interfaces.

In a lateral oxidation process, side portions of the mirror layers must be exposed for oxidation. For a lateral oxidation process for a top mirror, the same mesa etch used to form the top mirror mesa is sufficient to expose side portions of mirror layers for oxidation. However, lateral oxidation of bottom mirror layers is more difficult. A laterally oxidized bottom DBR mirror tends to have significant residual strain energy due to the fact that it may be larger in area than the top mirror and because the bottom mirror, which supports other portions of the VCSEL, cannot relieve strain from exposed surfaces as readily as the top mirror. Thus, a laterally oxidized bottom DBR mirror is of particular concern in regards to delamination.

In one embodiment of a bottom DBR mirror oxidation process, the lateral oxidation process is performed through one or more openings (e.g., etched trenches) formed in the bottom mirror layers. As illustrated in the top view of FIG. 4A, the openings 410 are spaced far enough apart that the VCSEL's bottom DBR mirror 420 is laterally supported. The oxidation conditions are adjusted such that the lateral oxidation 440 spreads throughout the desired bottom DBR mirror region. The spacing between the openings 410 and their location relative to the intended lasing region of the bottom mirror may be selected to retain connection portions 430 of the DBR mirror layers that connect the oxidized DBR mirror to unoxidized mirror layers 450.

Figure 4A:
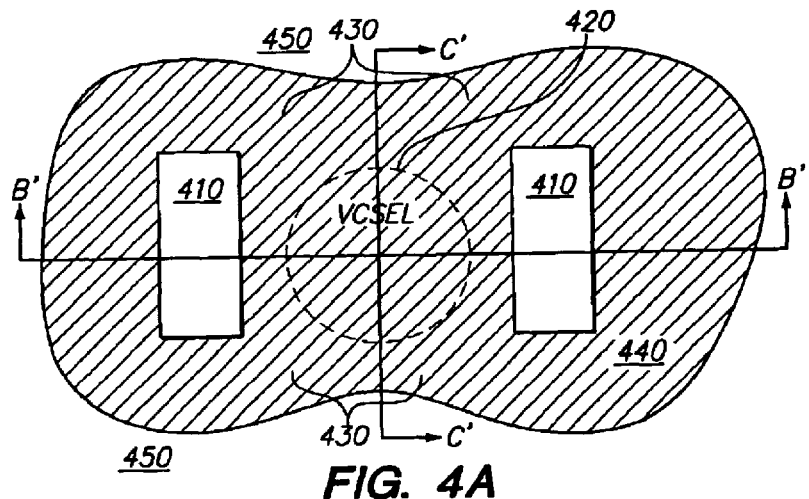
FIG. 4A is a top view illustrating a VCSEL having openings formed through oxidizable bottom DBR mirror layers which have been used to laterally oxidize a bottom DBR mirror while retaining regions for laterally supporting the bottom DBR mirror of the VCSEL.

Referring to FIG. 4A, in one embodiment of the present invention a process for laterally oxidizing a bottom mirror includes opening oxidation windows 410 proximate a side portion of the VCSEL's bottom DBR mirror 420. As one example, one or more trench openings may be formed that expose a portion of at least one side of oxidizable DBR mirror layers for the bottom DBR mirror. For example, two parallel trenches may be formed near the sides of the bottom VCSEL mirror 420. During the oxidation process, the oxidizable mirror layers are oxidized laterally about the openings 410. The composition of the oxidixable layer and the oxidation conditions (e.g., nitrogen/steam temperature and time) are selected such that the oxidizable layers in the bottom DBR mirror are oxidized substantially throughout the area 420 of the bottom mirror of the VCSEL which will reflect laser light.

Figure 4B:
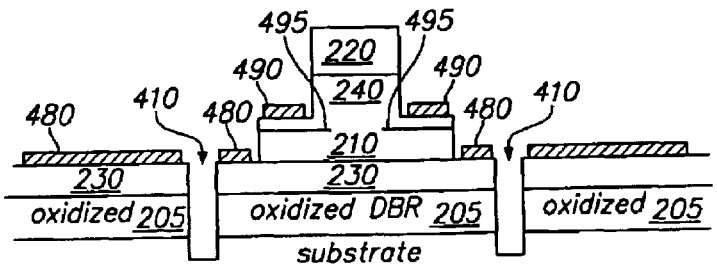
FIG. 4B is a cross sectional view through line A—A of FIG. 4A.

FIG. 4B is a cross sectional view through line A—A of FIG. 4A. Proximate trenches 410 the bottom mirror 205 is laterally oxidized. In a VCSEL process, a top mirror 220 may be defined by a mesa etch and suitable p contact 490 and n-contact layers 480 deposited on the contact layers 230 and 240. In one embodiment, top mirror 220 is laterally oxidized in the same oxidation step. Additionally, a current aperture layer 495 may also be oxidixed to limit current flow to VCSEL lasing regions.

Figure 4C:
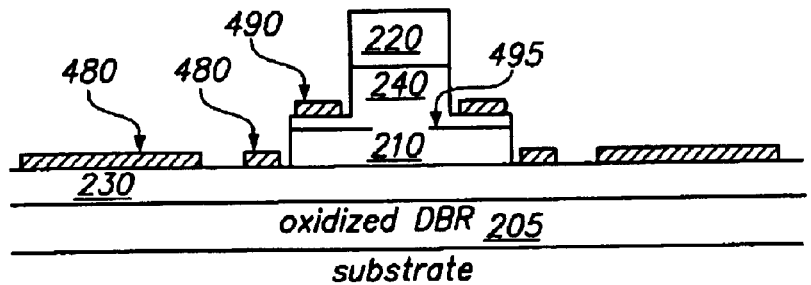
FIG. 4C is a cross sectional view through line B—B of FIG. 4A.

FIG. 4C is a cross-sectional view through line B—B of FIG. 4A. Note that lateral support to the bottom DBR mirror layer is provided in regions where the oxidized bottom mirror (outside of the VCSEL) is connected to unoxidized mirror material, thereby supporting the oxidized mirror and inhibiting delamination. Referring to FIG. 4A, it will be understood that it is desirable to select process conditions that oxidize the bottom DBR mirror in VSCEL areas that will emit light while also minimizing the total oxidized area 440 consistent with oxidizing bottom VCSEL mirror 420.

Contact Layer Design

In a VCSEL with at least one ultrahigh reflectivity oxide/semiconductor DBR mirror, the longitudinal optical mode will be tightly confined between the DBR mirrors 205 and 220. The contact layers 230 and 240 require a sufficient doping-thickness product to achieve an acceptable ohmic resistance. However, if the contact layers 230 and 240 are heavily doped, this can result in substantial optical losses due to free-carrier losses in the contact layers unless the thickness and doping profile of the contact layers is appropriately selected. Consequently, in one embodiment of the present invention the contact layers have a thickness and doping profile selected to permit a reasonable ohmic resistance to be achieved with a comparatively low optical loss.

The electrical contact layers 230 and 240 are designed to provide electron hole pairs into the quantum dot active region layers. The contact layers form a p-n diode junction for injecting electron hole pairs into quantum dot active region 210. For example, contact layer 240 may include a heavily doped p-type layer whereas contact layer 230 may include a heavily doped n-type layer. Additional current aperture layers (not shown in FIGS. 2A–2C) are preferably included to limit current injection to intended laser regions. In particular, the current aperture layers may comprise a layer of AlGaAs that is also oxidized in regions disposed away from the active region of the VCSEL, such as under contact pad metallizations. In one embodiment, the contact layers and associated aperture layers have a thickness of about a half of a wavelength. In one embodiment, the contact layers are not uniformly doped but instead are doped most heavily in regions where the optical field has the lowest intensity in the contact layers.

Doped contact layers 230 and 240 have an optical loss associated with free carrier absorption. The free carrier absorption increases with dopant concentration and the magnitude of the electric field of the longitudinal optical mode. The optical mode intensity outside of the active region 210 between DBR mirrors approximates an envelope function within which the intensity varies with a periodicity determined by the wavelength. Selecting each contact layer to have an optical thickness of less than about $\lambda/2$ facilitates placing the peak doping proximate an optical node of the longitudinal mode (e.g., a region having a low intensity). The precise free carrier loss may be minimized by using a computer analysis technique to integrate the loss through the contact layer based upon the dopant concentration and field strength at each point within the contact layer.

In one embodiment, each contact layer has a thickness of about $\lambda/2$ or less and includes a heavily doped layer having a thickness of about $\lambda/4$ or less. Selecting the heavily doped portion of the contact layers 230 and 240 to have a thickness of about $\lambda/4$ facilitates reducing the optical losses because the most heavily doped portion may be placed proximate a node in the optical intensity, e.g., the overlap of the field intensity is reduced. Consequently, in a preferred embodiment of the present invention the thickness of the contact layers is selected to be about $\lambda/2$ or less. In one embodiment, heavily doped contact layers have a thickness of about $\lambda/4$ or less.

Figure 5A:
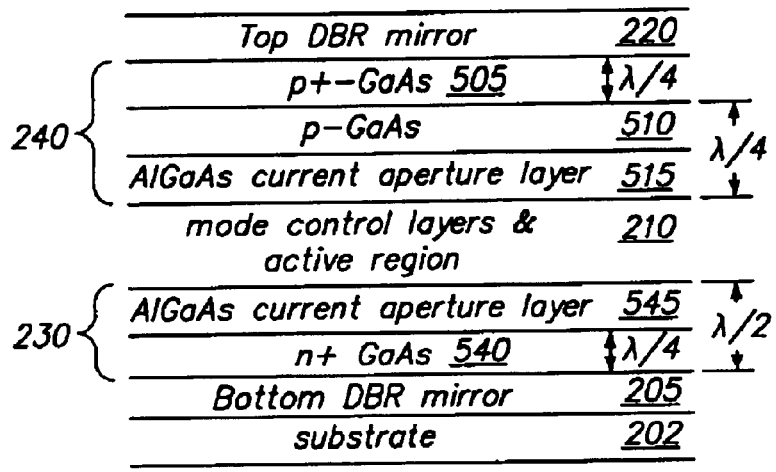
FIGS. 5A and 5B show layer sequences of VCSELs having an active region including a mode control layer with different intracavity contact layer implementations.
Figure 5B:
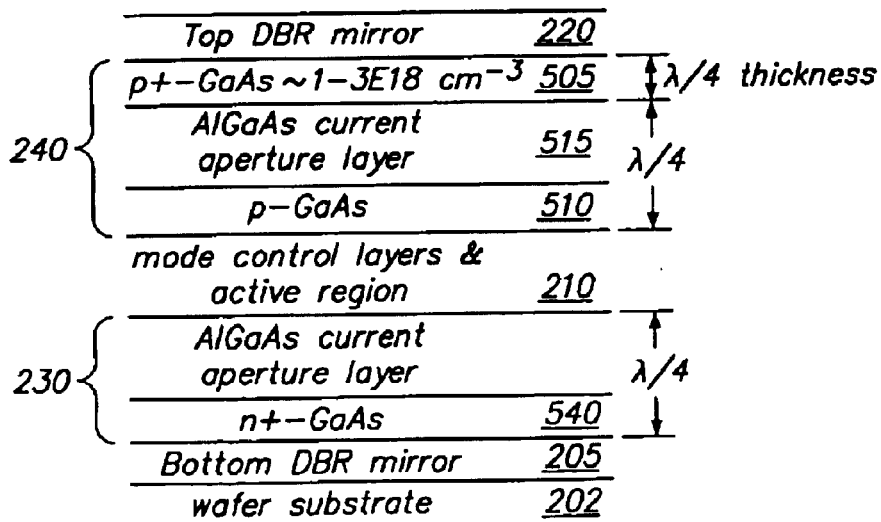

The optical absorption of the contact layers may also be reduced by grading the doping concentration to have a higher doping concentration in regions where the longitudinal mode has a lower intensity. Referring to FIGS. 5A and 5B, for p-contact layers in the GaAs materials system the p-contact layers 240 may comprise a highly doped p-type GaAs layer 505 proximate the bottom 204 of the top DBR mirror 220 and having a thickness of about $\lambda/4$. The remaining $\lambda/4$ thickness closest to the active region comprises a p-type GaAs layer 510 and AlGaAs current aperture layer 515 (e.g., a layer that can be selectively oxidized in contact pad regions to reduce parasitic conduction). A suitable n-type contact layer 230 may comprise a heavily n-doped GaAs layer 540 proximate the top surface of the bottom DBR mirror 205 and an AlGaAs current aperture layer 545.

An additional benefit of reducing the thickness of the contact layer thickness to an optical thickness of about $\lambda/2$ or less is that it increases the relative fraction of the mode confined to the active region. In particular, in a VCSEL with ultrahigh reflectivity mirrors only a small fraction of the light resides in the mirror layers. Following the procedures described in the present patent application, a reduction in the confinement factor of the mode in the contact layers results in a corresponding increase in the optical confinement factor within the active region.

Mode Control Layer to Reduce Contact Layer Absorption

Referring to FIGS. 5A and 5B, in one embodiment of the present invention the active region has an at least one associated mode control layer to further reduce optical loss in the contact layers. The function of the mode control layer is to adjust the shape of the longitudinal mode to beneficially reduce $\Gamma_c$ and achieve a high $\Gamma_{qd}$. One example of a mode control layer is any layer having a refractive index profile that adjusts the optical mode to place a longitudinal node proximate heavily doped contact layers such as to reduce the free carrier loss associated with the contact layers.

In one embodiment, the mode control layers create reflections selected to produce a resonance effect that beneficially alters the longitudinal mode intensity distribution between the top and bottom mirrors 205 and 220. As one example, each mode control layer may comprise a single layer functioning as a mirror layer and permitting the passage of an electrical current, with the mirror layer reducing the optical intensity within the contact layers. As indicated in FIG. 5B, in one embodiment the active region is an integral number of half-wavelengths in thickness and includes a plurality of quantum dot layers, with each quantum dot layer being a plurality of quantum dots embedded in a quantum well. It should be understood that other VCSEL designs could result in the presence of quarter-wave phase shift layer with concomitant change in the other layer thicknesses. In this embodiment, the mode control layers comprise an approximately quarter wavelength thickness region of low index or high index layers.

Figure 6A:
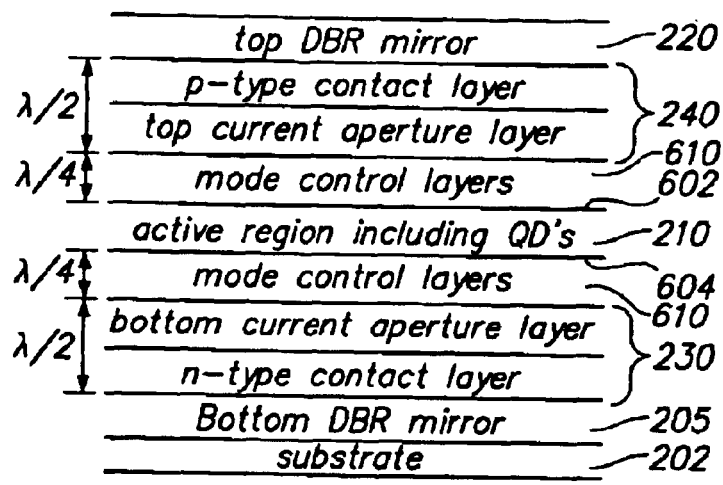
FIG. 6A shows a layer sequence of an embodiment having two mode control layers.

Referring to FIG. 6A, in one embodiment, each of the mode control layers 610 are regions disposed between the first or second ends 602 or 604 of the active region 210 and a respective mirror. In one embodiment, each mode control layer is a $\lambda/4$ thick layer having a different refractive index than adjacent layers (e.g., functions a partial DBR mirror). The difference in refractive indices between the mode control layer 610 and adjacent layers creates optical reflections. By appropriately selecting the thickness of the active layer, contact layers, and mode control layers, a resonance condition is established with the additional reflections of the mode control layers 610 beneficially altering the longitudinal mode intensity profile between the mirrors.

Figure 6B:
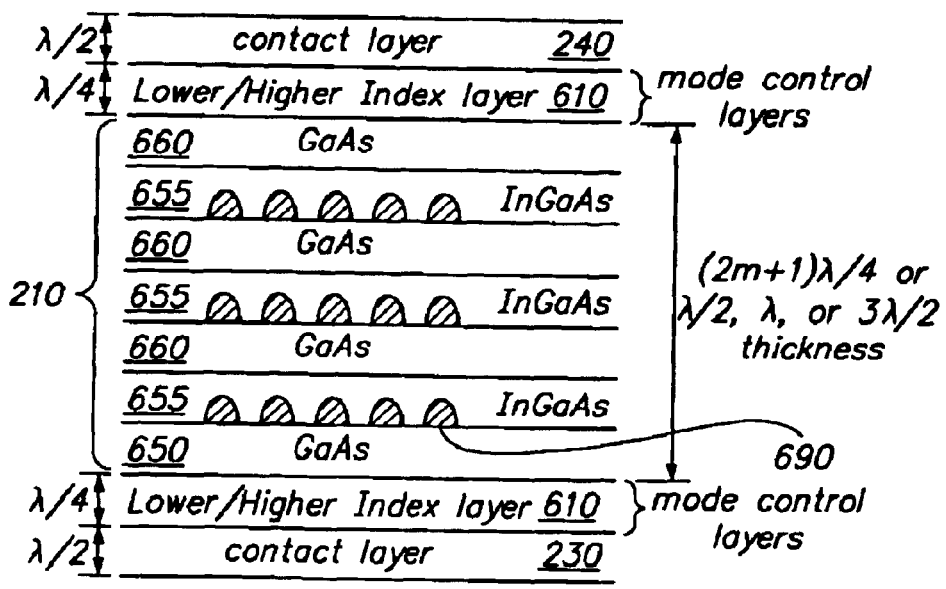
FIG. 6B illustrates in more detail an embodiment of a layer sequence for an active region and mode control layers along with illustrative thicknesses in terms of the optical wavelength in the laser.

A detail of an exemplary active region with mode control layers 610 are shown in FIG. 6B. Active region 210 includes quantum dot layers 655 with InAs quantum dots 690. The mode control layers 610 may comprise layers having either a lower or higher refractive index than adjacent layers. If the refractive index is higher, the thickness of the active region is preferably an integer number of half wavelengths. If the refractive index is lower, than the active region is preferably an odd multiple of quarter wavelengths in thickness. and GaAs barrier layers 660.

The resonant reflections can be used to create large changes in longitudinal mode intensity between top and bottom DBR mirrors. FIG. 16A illustrates optical field intensity 1600 versus distance across the active and contact layers of a VCSEL having high reflectivity top and bottom DBR mirrors in a structure that does not have mode control layers 1610. For the purposes of illustration, VCSEL cavity components are superimposed on the plot. For typical contact layer alloy compositions and active layer structures the refractive indices of the layers is approximately uniform over optical-scale distances. Consequently, the longitudinal optical mode is essentially periodic between the two mirrors. This results in a high overlap of the field in contact layers, resulting in high cavity losses.

Figure 16B:
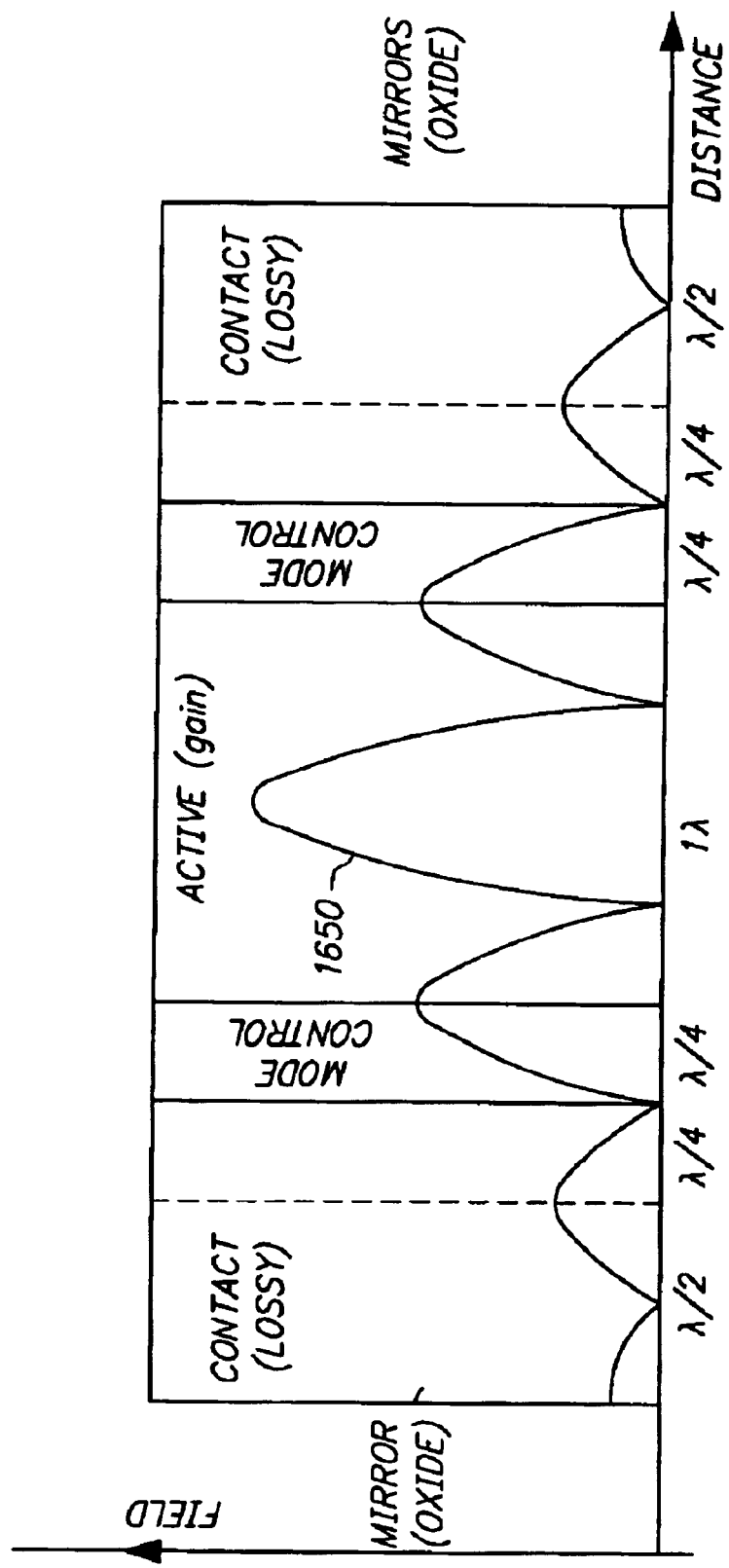
FIG. 16B is an illustrative graph of longitudinal mode intensity in a VCSEL having mode control layers.

FIG. 16B is a plot 1650 of longitudinal mode intensity versus distance in a VCSEL that illustrates the effect of mode control layers 610 having a refractive index profile and placement selected to produce a resonance condition. In this example, the mode control layers are quarter wavelength thick mode control layers comprised of a lower index material (e.g., AlGaAs layers). The resonant reflections from the mode control layers simultaneously increases the optical confinement factor of the active region while also reducing the confinement of the mode in the contact layers. The result for a VCSEL with optimized contact layer thicknesses is that the optical confinement factor, $\Gamma_{qd}$, of quantum dot layers in the active region increases by a factor of about two and the contact layer confinement factor, $\Gamma_c$, simultaneously decreases by about a factor of two. The net result is that the threshold gain decreases by up to a factor of four.

Figure 8:
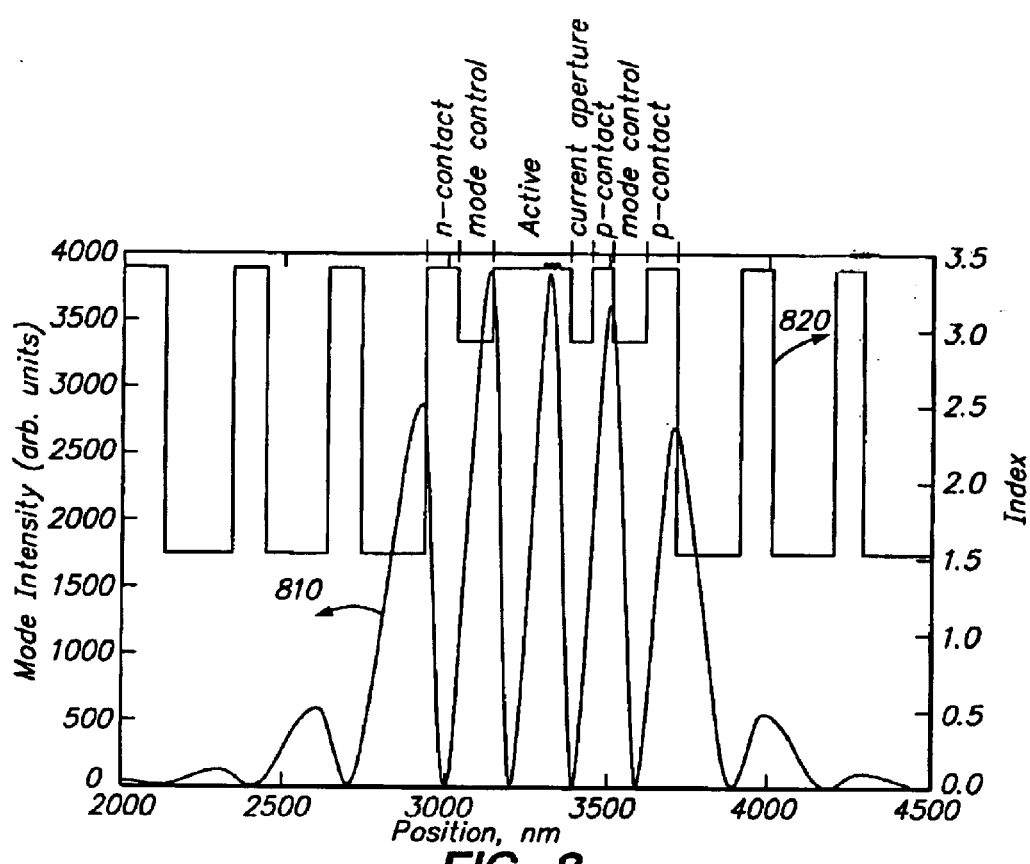
FIG. 8 shows plots of the refractive index of key layers for the layer sequence VCSEL of FIG. 7 and the calculated intensity of the longitudinal mode.

FIG. 7 shows an exemplary sequence of grown layers for a quantum dot VCSEL 700 including DBR mode control layers. Exemplary thicknesses, dopings, and MBE growth temperatures are shown. FIG. 8 shows plots of mode intensity 810 and refractive indices 820 through the VCSEL (with oxidized AlAs mirror layers). The active region includes three InGaAs quantum wells approximately 9 nm in thickness. Approximately 2.4 monolayers of indium are deposited under growth conditions selected to form quantum dots, e.g., 1 nm of the quantum well is grown, approximately 2.4 equivalent monolayers of Indium Arsenide are deposited to form InAs islands, and a top 8 nm InGaAs layer is deposited to embed the InAs islands. In this example, the mode control layers 610 comprise 107 nm thick regions of $Al_{0.92}Ga_{0.08}As$. The top and bottom DBR mirrors 205 and 220 comprise alternating nominally AlAs/GaAs layers. For improved processing control, the AlAs layer is preferably $Al_{0.98}Ga_{0.02}As$, since this facilitates controlling the rate of lateral oxidation. Between each pair of AlAs/GaAs layers is an intermediate layer of $Al_{0.92}Ga_{0.08}As$ to inhibit delamination. The contact layers are preferably doped to reduce ohmic contact resistance. Layers which are to be oxidized are preferably lightly doped or undoped. Electrical interfaces between regions having different AlGaAs compositions may be graded in composition, if desired, to reduce electrical resistance. Note that the number of mirror pairs of each mirror does not have to be identical, e.g., in this example the bottom mirror 205 has more mirror pairs than the top mirror 220. Additionally, it can be seen in FIGS. 7 and 8 that a mode control layer 610 may be placed between one or more of the contact layers. In particular, in some applications it is desirable to place a current aperture layer as close to the active regions as possible, in which case the mode control layer may be placed between the current aperture layer and highly doped contact layers.

Referring to FIG. 8, the longitudinal mode intensity 810 is tightly confined about the active region with an antinode centered in the quantum dot layers. The longitudinal mode has an antinode proximate each contact layer, which reduces optical absorption. The doping within each contact layer may also be graded to have a peak doping concentration in regions having a low optical intensity, thereby further reducing optical absorption.

Active Layer Design for Increased Gain

The modal quantum dot gain may be increased by selecting growth parameters that increase the quantum dot density, increasing the number of quantum dot layers consistent with strain limitations, and arranging the quantum dot layers to increase the optical confinement factor of the quantum dots.

A preferred growth technique is molecular beam epitaxy (MBE) with the quantum dot layer grown at a temperature between about 450° C. to 540° C. The other layers (top mirror, bottom mirror, and contact layers) are preferably grown at a temperature below about 600° C. (e.g., 580° C. to 600° C.) to limit the possibility of blue-shifting of the quantum dots as a result of diffusion of quantum dot layers. A conventional optical pyrometer may be used to determine the temperature. The arsenic flux is preferably chosen to achieve an arsenic stabilized surface.

In a preferred embodiment, the quantum dots form as self-assembled islands. InAs has a relaxed lattice constant that is more than about 2% greater than the underlying semiconductor layers, a Stranski-Krastanow (S-K) growth mode occurs once a sufficient number of equivalent monolayers of InAs are deposited. In the S-K growth mode, the driving force for the formation of islands is the reduction in strain energy afforded by elastic deformation, i.e., for S-K growth it is more energetically favorable to increase surface energy by islanding than by relaxing strain by dislocation generation. In a S-K growth mode, the growth becomes three dimensional after a critical thickness of the larger lattice constant material is grown upon an initial wetting layer.

Figure 9:
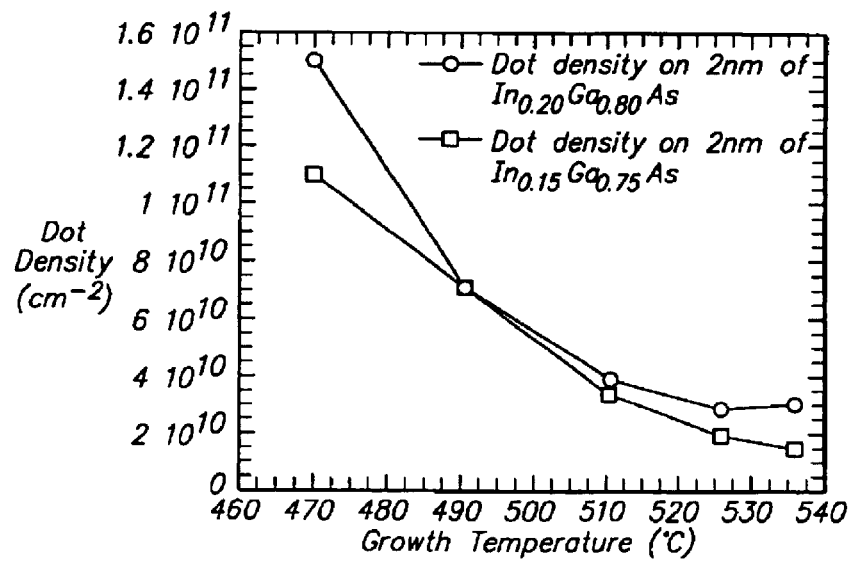
FIG. 9 is a plot of quantum dot density versus growth temperature for self-assembled InAs quantum dots grown by molecular beam epitaxy on InGaAs layers.

FIG. 9 is a plot of quantum dot density versus MBE growth temperature for quantum dots grown on two different InGaAs well layer compositions. It can be seen that the dot density depends strongly upon temperature and also upon the composition of the bottom well layer. Dot densities of greater than $1 \times 10^{11}$ cm$^{-2}$ may be achieved at a growth temperature of about 470° C. The dot density can be adjusted by more than a factor of five by selecting a growth temperature between 470° C. to 540° C. Experiments indicate that the dot density is at least a factor of two higher when the dots are grown on an InGaAs layer compared with a GaAs layer at a comparable temperature. The dot density also increases when the InGaAs alloy composition is increased from $In_{0.1}Ga_{0.9}As$ to $In_{0.2}Ga_{0.8}As$. Experiments by the inventors indicate that the thickness of the bottom InGaAs well layer may be extremely thin and still have the same effect as a thick layer in regards to the nucleation of quantum dots on the bottom InGaAs layer. Thus, to achieve a reproducible dot density, the bottom well layer need only have a thickness consistent with it having a reproducible thickness and alloy composition. The bottom well layer may have a thickness as low as 0.5 nm, although a thickness of about one nanometer may be easier to reproducibly grow.

Figure 10:
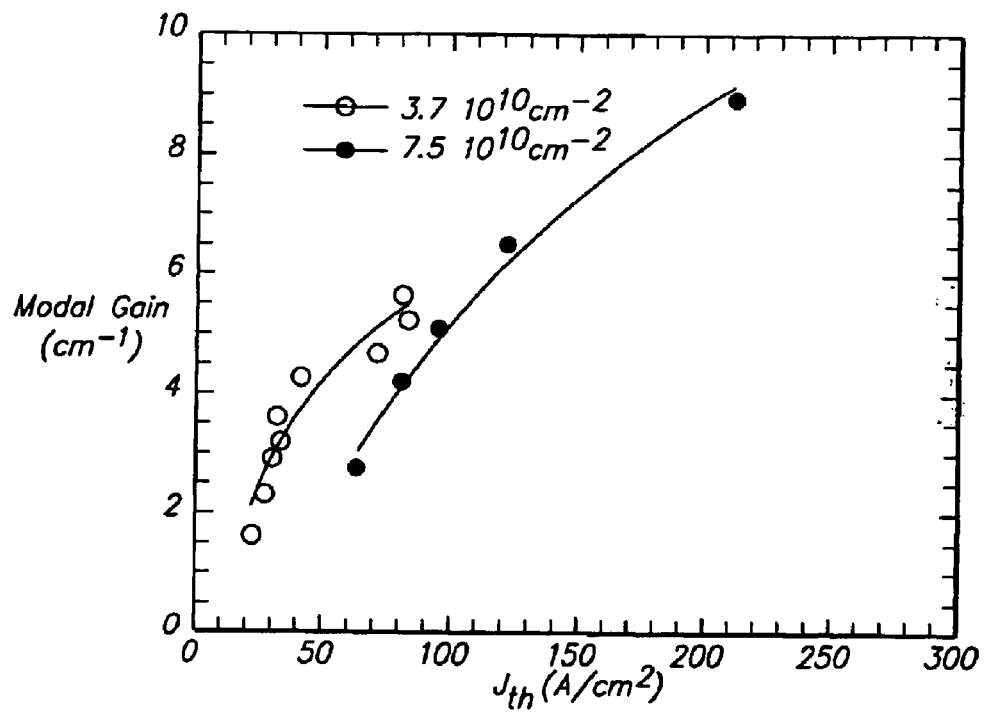
FIG. 10 shows plots of modal gain versus current density for two different quantum dot densities.
Figure 11:
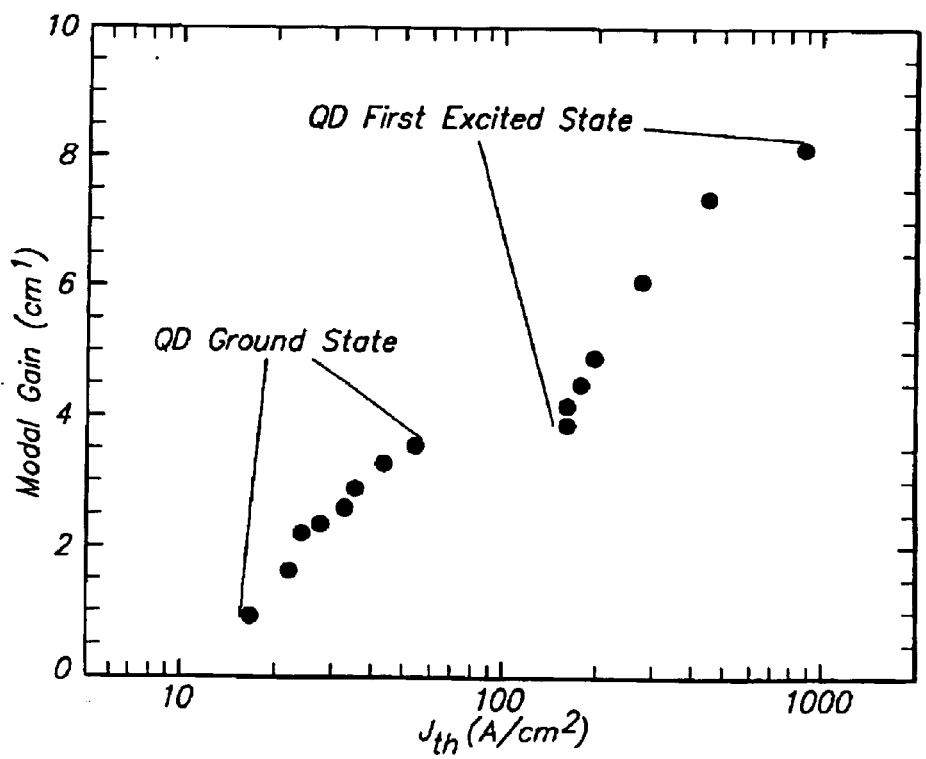
FIG. 11 is a plot illustrating a jump in gain associated with excited states of the quantum dots at high current densities.

FIG. 10 is a plot of modal gain versus current density of edge emitting lasers for two different dot densities. It can be seen in FIG. 10 that the modal gain of each quantum dot layer increases with increasing dot density. Consequently, in one embodiment a quantum dot growth temperature is selected to increase the quantum dot density. The ground state gain of a quantum dot has a maximum (saturated) optical gain due to the delta-like density of states of quantum dots. However, at high pumping levels additional excited states may be accessible to provide additional gain at shorter wavelength, as indicated in the plot of FIG. 11.

Figure 12A:
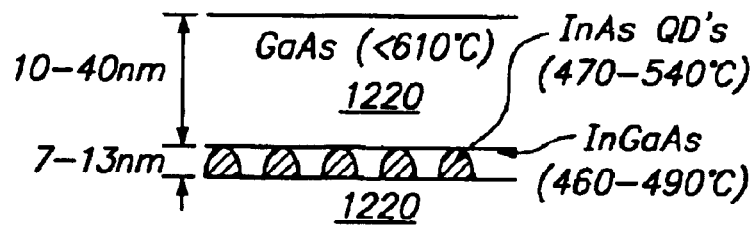
FIG. 12A illustrates preferred quantum dot growth parameters for InAs quantum dots and FIG. 12B illustrates a technique for embedding quantum dots in quantum wells.
Figure 12B:
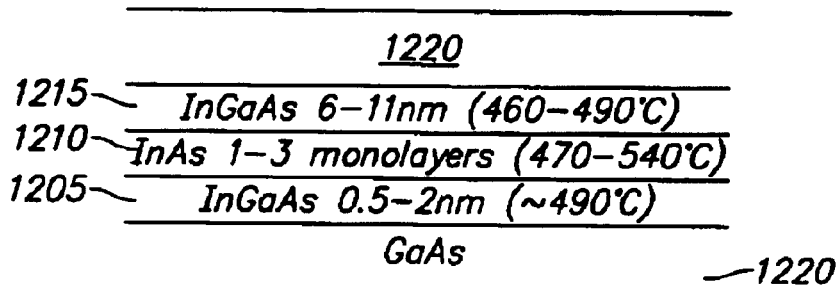

FIGS. 12A and 12B shows exemplary growth temperatures and thicknesses for a quantum dot layer. FIG. 12A shows embedded quantum dots (QDs) and FIG. 12B shows a corresponding growth layer sequence. The quantum dots 1210 are formed on a first well layer 1205 of InGaAs and embedded in a second well layer 1215 of InGaAs. In one embodiment, a bottom InGaAs quantum well layer of between about 0.5 to 2 nm in thickness is grown on top of a GaAs barrier layer. An InAs floating layer is preferably initially deposited on the GaAs layer to raise the surface indium concentration close to its equilibrium concentration at the growth temperature, thereby improving the compositional uniformity of subsequent InGaAs layers. The equilibrium concentration of segregated (floating) indium depends on temperature and InGasAs composition but is typically about 0.5 to 1 monolayers over a range of common growth parameters.

An InGaAs quantum well composition of between about $In_{0.1}Ga_{0.9}As$ to about $In_{0.2}Ga_{0.8}As$ is preferred. Higher indium molar fractions tend to increase the dot density and the depth of the energy barrier for confining electrons and holes in the quantum well. However, higher indium concentrations also increase the strain associated with each layer. Typically about 1 to 3 monolayers of InAs is deposited to form InAs islands. A top well layer of about 6 to 11 nanometers of InGaAs may be used to embed the InAs. A GaAs layer of about 10–40 nm is grown to form a second quantum well barrier. In one embodiment, a desorption step is performed after growth of the top InGaAs layer to planarize any residual InAs islands that protrude above the top InGaAs layer. The time and temperature of the desorption step are preferably selected to rapidly planarize protruding InAs regions but to preserve InGaAs. In one embodiment, several monolayers of GaAs are deposited before the desorption step to facilitate maintaining a stable top InGaAs well layer during the desorption step.

The number of quantum dot layers and their spacing is limited, in part, by strain effects. The strain thickness product of an individual layer of quantum dots should be sufficiently low to prevent the formation of deleterious dislocation and defects. Additionally, the cumulative strain associated with all of the layers should be sufficiently low to prevent the formatting of deleterious defects. For a sequence of quantum dot layers of an active region 210, an average strain-thickness product should be below a threshold average strain (e.g., 0.5%). The strain thickness product of an individual quantum dot layer is $E_w T_w$, where $E_w$ is the strain of a well layer and $T_w$ is the thickness of the well. The strain thickness product of an individual barrier layer is $E_b T_b$, where $E_b$ is the strain of the barrier layer and $T_b$ is the thickness of the barrier layer. For a sequence of n layers of dots, the average strain, $E_{av}$, is:

$$E_{av} = \frac{(n+1)EbTb + nEwTw}{(n+1)Tb + nTw}. \qquad \text{Eq. 2}$$

For GaAs barriers (which are unstrained), this simplifies to:

$$E_{av} = \frac{nEwTw}{(n+1)Tb + nTw}. \qquad \text{Eq. 3}$$

Equation 2 can be re-expressed as a relationship between the barrier thickness, well thickness, modified average strain, strain in the barriers, and strain in the well:

$$Tb = \frac{nTw(Ew - Eav)}{(n+1)(Eav - Eb)} \qquad \text{Eq. 4}$$

For GaAs or AlGaAs layers grown on a GaAs substrate $E_b \approx 0$ so that the barrier thickness is:

$$Tb = \frac{nTw(Ew - Eav)}{(n+1)Eav}. \qquad \text{Eq. 5}$$

Equation 5 can be used to derive a relationship for a minimum barrier layer thickness. If the average strain is selected to be less than a maximum average strain (for example, and average strain less than about 0.51%), $E_{avmax}$, then the following relationship holds:

$$Tb > \frac{Tw[n(Ew - Eav\,\text{max})]}{(n+1)Eav\,\text{max}}. \qquad \text{Eq. 6}$$

As an illustrative example, if $E_{avmax}$ is 0.4 and $E_w$=1.45 for an average In alloy composition of about $In_{0.2}Ga_{0.8}As$ then Tb>2.625Tw(n/(n+1)). If Tw is 9 nm for a structure, then the minimum barrier thickness for a structure with 6 quantum dot layers is about 20 nanometers.

The quantum dot layers within the active region are preferably placed proximate an anti-node (a region of peak optical intensity) of the longitudinal mode, since this beneficially increases the optical confinement in each quantum dot layer. In one embodiment, approximately three-to-six quantum dot layers are placed about each antinode. Using less than three quantum dot layers per antinode typically produces less gain than desired for many applications. With more than six quantum dot layers per antinode, the total spacing required to be within acceptable strain limits makes it difficult to achieve a high optical confinement for each quantum dot layer. For many applications, a preferred number of quantum dot layers per antinode is three-to-four, since using more quantum dot layers tends to increase the threshold current.

Figure 13:
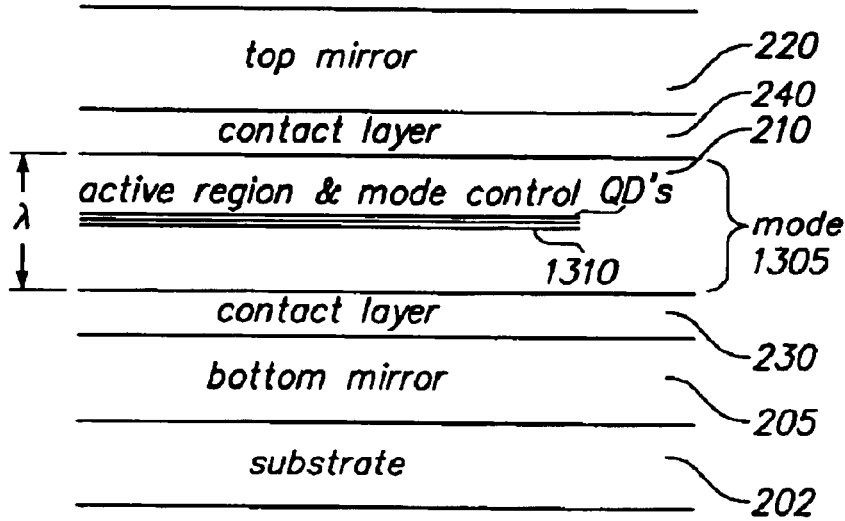
FIG. 13 illustrates an embodiment in which quantum dot layers are placed proximate a single antinode.
Figure 14:
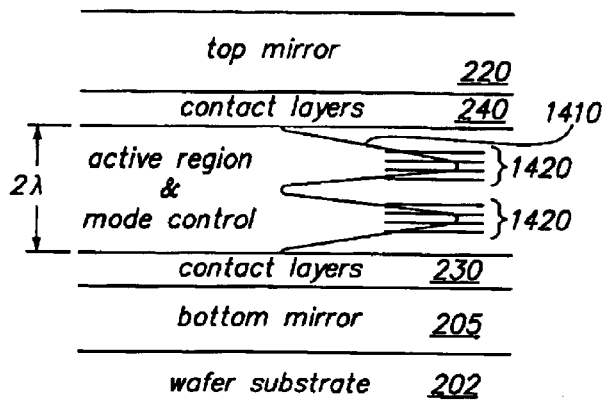
FIG. 14 illustrates an embodiment in which quantum dot layers are placed proximate two antinodes.

In one embodiment, the active region has a thickness selected to generate a single antinode centered within the active region and mode control layers. As indicated in FIG. 13, in one embodiment, the quantum dot layers 1310 are positioned proximate the single antinode 1310 of the longitudinal mode. In an alternate embodiment, the active region and mode control layers are centered on a node and has a thickness selected such that there are at least two antinodes within the active region. In this embodiment, quantum dot layers are disposed proximate each antinode. FIG. 14 illustrates a VCSEL having two sets of quantum dot layers 1420 with each set centered about one of two antinodes 1410. For example, each set of of quantum dot layers 1420 may comprise three or four quantum dot layers.

Device Processing

Figure 15A:
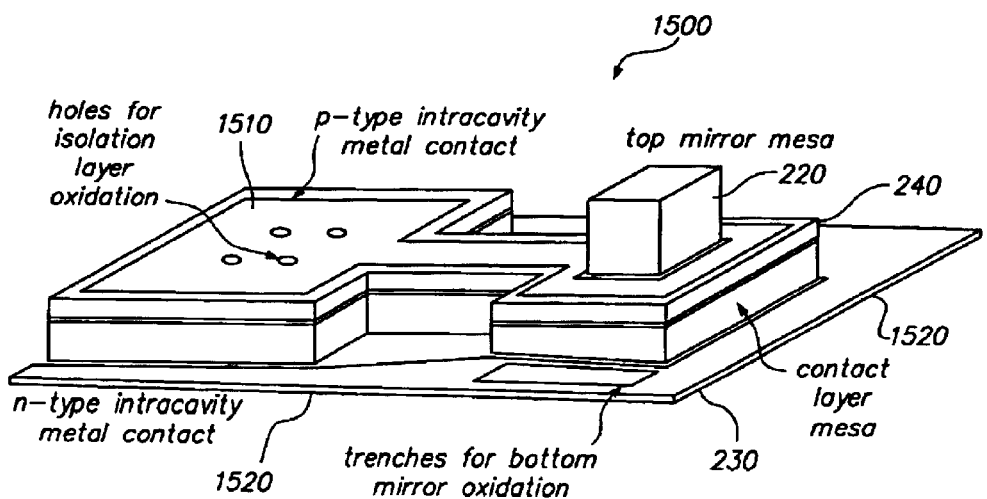
FIG. 15A is a perspective view illustrating a processed VCSEL.
Figure 15B:
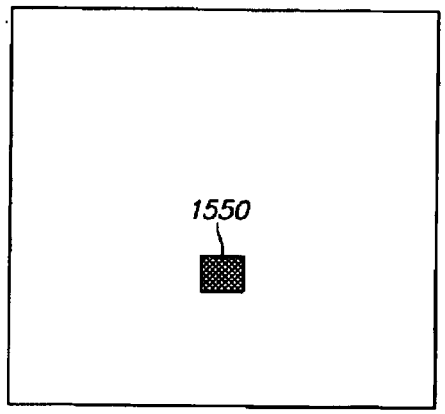
FIG. 15B illustrates a top mirror mesa etch mask step to etch to a first contact layer and holes for vertical isolation of the two contact layers using lateral oxidation.

FIG. 15A is a perspective view of an exemplary processed VCSEL 1500 fabricated in accord with one embodiment of the present invention. The processing includes steps for etching down to the p-type contact layers 240 in regions outside of the desired top mirror 220 of the VCSEL. Conventional photolithography processes are used. An exemplary top mirror area is about 14 to 30 microns square. A suitable mask layer (e.g., a photoresist mask) having a mask region 1550 for protecting the top mirror during the first etch process is illustrated in FIG. 15B. The etch process may use any suitable wet or dry etch process. In one embodiment, an inductively coupled plasma (ICP) etch process is used. ICP provides the benefits of a high aspect ratio and comparatively low ion energies. After the p-type contact layer etch, a p-metal layer 1510 is deposited to form the p-contact.

Figure 15C:
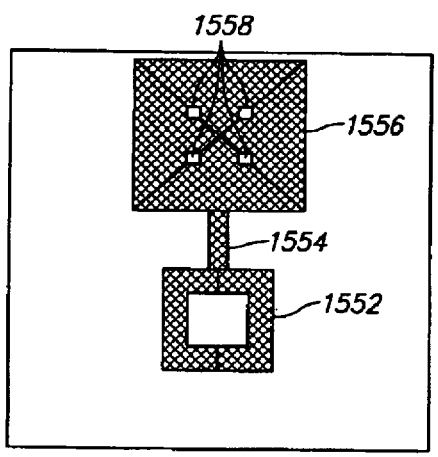
FIG. 15C illustrates a first metal deposition step.

FIG. 15C shows an exemplary p-metallization. Examples of p-metal layers include Au/Zn/Au metallization. A ring 1552 of p-contact metal is formed on the p-contact layer around the top mirror mesa to provide a low electrical resistance. In one embodiment, the ring 1552 is about ten microns wide and connected to a pad 1556 by a neck 1554 about ten microns wide and about forty microns long. An exemplary p-contact pad is about 100 microns by 100 microns in area. The p-contact layer includes holes 1558 on a pad region to permit via holes to be etched down to a current aperture layer, which is oxidized during the mirror oxidation process. As one example, each hole 1558 may be about ten microns square.

Figure 15D:
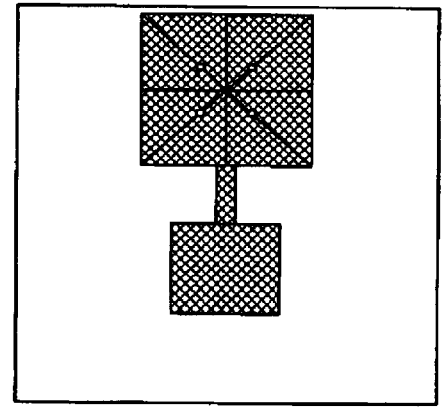
FIG. 15D illustrates an etch step to etch to a second contact layer.

A cavity mesa etch is used to etch down to the n-type contact layer 230. A suitable mask layer is shown in FIG. 15D to protect the top mirror mesa and p-contact metallization.

Figure 15E:
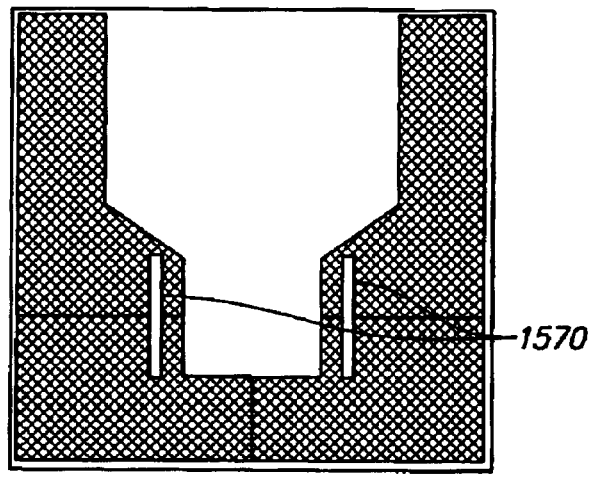
FIG. 15E illustrates a second metal deposition step.
Figure 15F:
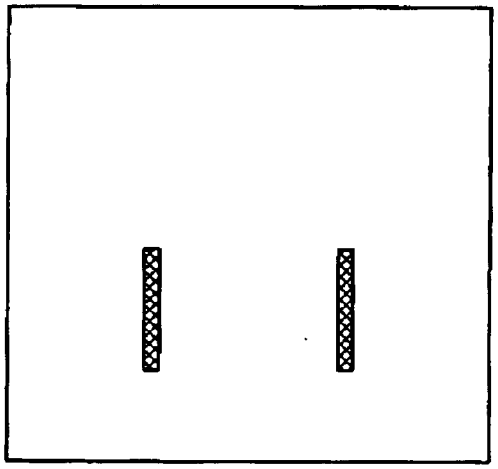
FIG. 15F illustrates a bottom mirror opening etch step.

An n-metal contact layer 1520 is deposited on the n-contact layer. As one example, the n-metal contact layer be a AuGe/Ni/Au contact. A suitable mask is shown in FIG. 15E. For embodiment in which there the bottom mirror layer is to be oxidized, two trenches 1570 are included. In one embodiment, each trench may be about seven microns wide and about seventy microns long. An oxygen plasma or other cleaning step may be used to clean the sample prior to lateral oxidation in a water vapor oxidation process. As indicated in FIG. 15F, an additional mask may be used to etch a trench down through the bottom mirror. A single lateral oxidation step may be used to simultaneously oxidize the top mirror, contact pad isolation, and the bottom mirror.

Figure 15G:
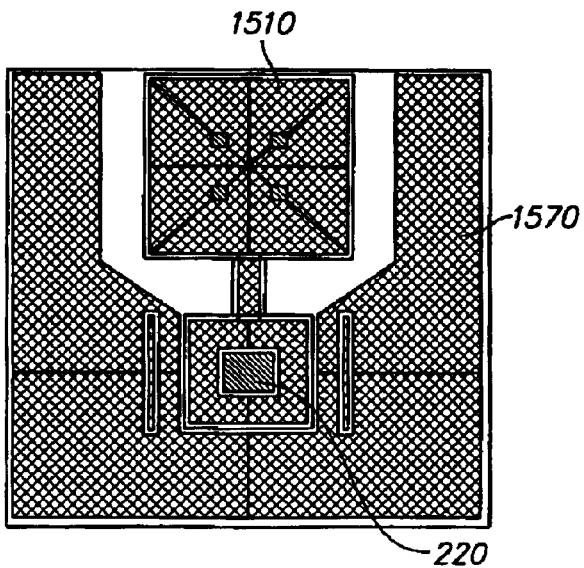
FIG. 15G illustrates a top view of a fabricated VCSEL.

FIG. 15G shows a top view of a completed VCSEL.

Low Threshold Gain VCSELs for Extended Temperature Range Operation

An important benefit of the VCSEL structure of the present invention is that the threshold gain may be selected to be below the saturated ground state gain over an extended temperature range. As previously described, the ground state transition energy of a layer of quantum dots has a maximum gain at which the gain saturates. The saturated ground state gain decreases with increasing temperature. Thus, reducing the threshold gain increases the ambient temperature operating range, e.g., a low threshold gain permits a VCSEL to be operated at higher temperatures.

The combination of features of the present invention permits an approximately order of magnitude reduction in threshold gain compared with a conventional quantum well VCSEL. First, optical absorption in contact layers is reduced due to the comparatively thin doped contact layers (e.g., contact layers with heavily doped regions less than $\lambda/2$ in thickness), the mode control layers which reduce the optical intensity in contact layers, and the grading of doping profiles in contact layers, which places the highest doping concentrations in regions with the lowest optical intensity. Consequently, the optical absorption in the contact layers by at least a factor of two compared with conventional VCSELs having $\lambda$ thick layers.

Second, the anti-delamination features of the present invention facilitates the use of ultra-high reflectivity DBR mirrors, which also reduces the threshold gain. In particular, the anti-delamination features of the present invention permit oxide/semiconductor DBR mirrors to be manufactured that have about a factor of ten lower mirror loss than conventional semiconductor DBR mirrors. Third, the arrangement of quantum dot layers within the active region facilitates achieving a high optical confinement factor of quantum dot layers, further reducing the threshold gain requirements.

The high reflectivity mirrors in combination with the mode control layers results in an increase in the available optical gain by about a factor of 1.5 to 2 due to the increased optical confinement factor for the quantum dots. This, in combination with the approximately factor of two reduction in the optical loss in the contact layers results in the VCSEL having an approximately 3-to-4 fold improvement in gain versus loss. As an illustrative example, a typical ground-state saturated gain of a multiple layer quantum dot active layer may be 25 cm$^{-1}$ or more at room temperature. In a VCSEL of the present invention having top and bottom oxidized mirrors, mode control layers, and thin contact layers, the cavity loss is only about 10 cm$^{-1}$. This means that there is a 15 cm$^{-1}$ margin. This permits, for example, the laser to be operated at an elevated temperature for which the saturated gain decreases by more than a factor of two (e.g., to 12.5 cm$^{-1}$).

Referring to FIG. 8, in one embodiment the reflectivity of top and bottom oxidized mirrors exceeds 99.9%. For example, an oxidized DBR mirror with eight AlO/GaAs DBR mirror pairs has a calculated longitudinal mode reflectivity of 99.999943% while an AlO/GaAs DBR mirror with five mirror pairs has a calculated longitudinal mode reflectivity of 99.97%. An optimized VCSEL structure similar to that shown in FIG. 8 has a quantum dot optical confinement factor of between about 1–2%, depending upon the number of quantum dot layers. The optical losses associated with contact layers has been reduced to a value about the same as the loss due to the mirror transmission. The calculated differential efficiency is about 50%.

As a consequence of the above described features, QD-VCSELS lasing in the ground state transition energy over an extended temperature range may be designed. For a particular application, such as a laser operating between a first temperature (e.g., 0° C.) to a second temperature (e.g., 85° C.), the saturated ground state gain at each temperature may be calculated and the cavity loss is selected to permit lasing over the temperature range.

An edge-emitting quantum dot laser may be used to empirically determine the range of QD gain between two temperatures. The effects of the DBR mirrors may be simulated by using an external cavity laser configuration in which a diffraction grating mirror provides wavelength selective feedback to a Fabry-Perot laser ("gain chip"). The threshold gain/cavity losses for the external cavity may be determined by characterizing the external grating mirror reflectivity and coupling optics. This threshold gain is the value that the gain chip must satisfy. At the selected wavelength and its associated threshold gain, the maximum operating temperature of the laser chip can be assessed by varying its temperature alone. Thus, the relationship between gain and temperature can be incorporated into the design of the VCSEL cavity.

The VCSEL design may then be adjusted to achieve a threshold gain less than the saturated quantum dot gain at the highest operating temperature. For example, if an extended operating temperature range is desired, the mirror loss may be reduced by increasing the number of DBR mirror layers and/or using oxidized mirrors in both the top and bottom DBR mirror. Alternatively, the number of quantum dot layers may be increased.

It will be understood that the present invention is not limited to AlGaAs materials. Examples of other III–V materials systems include AlGaInAs and related ternary alloys; AlInAs and GaInAs on InP substrates; and AlGaAsSb and AlAsSb, and GaAsSb and associated ternary alloys on InP. For example, mode control layers generating resonant reflections may be incorporated in VCSELs fabricated from a variety of materials. Additionally, since lateral oxidation occurs in a variety of III–V materials, such as alloys formed from digital alloys having AlAs layers, the lateral oxidation of bottom DBR mirrors through trench openings may be applied to a variety of III–V materials.

While particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A quantum dot vertical cavity surface emitting semiconductor laser (VCSEL), comprising:
    a first distributed bragg reflector (DBR) mirror disposed on a substrate layer comprised of a first plurality of mirror pairs with each mirror pair including layers having a step change in indices of refraction;
    a second distributed bragg reflector (DBR) mirror comprised of a second plurality of mirror pairs with each mirror pair including layers having a step change in indices of refraction;
    a semiconductor quantum dot active region disposed between a top of the first DBR mirror and a bottom of the second DBR mirror, the quantum dot active region including a plurality of quantum dots embedded in a plurality of quantum wells disposed proximate at least one antinode of a longitudinal optical mode, the quantum dots having a corresponding optical confinement factor;
    first and second doped semiconductor intracavity contact layers each having a thickness of no more than about half a wavelength disposed between the first and second DBR mirrors positioned and doped to inject electron-hole pairs into the quantum dot active region in response to a drive current;
    the mirror pairs of at least one of the DBR mirrors comprised of a semiconductor layer and an oxidizable semiconductor layer which has been oxidized to form a material with a refractive index substantially lower than the unoxidized semiconductor, increasing the reflectivity of the mirror; and
    at least one mode control layer disposed between the top of the first DBR mirror and the bottom of the second DBR mirror forming a refractive index profile to increase optical confinement of the quantum dot active region and reduce optical confinement in the contact layers.

2. The VCSEL of claim 1, wherein the number of quantum dot layers, the optical confinement of the quantum dot layers, and an optical overlap in doped contact layers is selected to achieve a threshold gain that is less than a saturated gain of a ground state of the quantum dots over a temperature range between about 0° C. to about 85° C.

3. The VCSEL of claim 2, wherein the active region has a longitudinal thickness that is about an integer number of half wavelengths in the laser at a target emission wavelength.

4. The VCSEL of claim 1, wherein each mode control layer has a longitudinal thickness of about one quarter of the emission wavelength in the laser, has a refractive index different that adjacent layers, and is positioned in the cavity to form a resonant reflection acting to increase the longitudinal mode intensity in the quantum dot active region and decrease the longitudinal mode intensity in the contact layers.

5. The VCSEL of claim 4, wherein there is a first mode control layer disposed between a first end of the active region and the first mirror and a second mode control layer disposed between a second end of the active region and the second mirror.

6. The VCSEL of claim 5, wherein each mode control layer is disposed between an end of the active region and a heavily doped contact layer.

7. The VCSEL of claim 1, wherein the second DBR mirror comprises mirror pairs having an oxide layer and a semiconductor layer.

8. The VCSEL of claim 7, wherein the first DBR mirror comprises mirror pairs having a semiconductor layer and an oxidizable semiconductor layer with at least one opening is formed in the first DBR mirror through the oxidizable semiconductor layer to laterally oxidize the oxidizable layers with a laterally connecting portion of the first DBR mirror along at least one side of the first DBR mirror to inhibit delamination of the first DBR mirror.

9. The VCSEL of claim 1, wherein the at least one DBR mirror comprised of a semiconductor layer and an oxidizable semiconductor layer further comprises: an intermediate layer disposed between the semiconductor layer and the unoxidizable semiconductor layer having a composition selected to inhibit delamination of the oxidized DBR mirror.

10. The VCSEL of claim 8, wherein the substrate is a GaAs substrate and the quantum dots comprise self-assembled InAs quantum dots formed in InGaAs quantum wells, and the DBR mirrors layers comprise alternating layers of $Al_xGa_{1-x}As$ and $Al_yGa_{1-y}As$, where x is greater than y.

11. The VCSEL of claim 10, wherein the Al molar fraction of the $Al_xGa_{1-x}As$ layer is selected to be between about 0.95 to 0.99 whereby the oxidation rate of the $Al_xGa_{1-x}As$ layer is controlled.

12. The VCSEL of claim 1, wherein there is a first mode control layer is disposed between a first end of the active region and the first mirror and a second mode control layer disposed between a second end of the active region and the second mirror, each mode control layer having a longitudinal thickness of about one quarter of the emission wavelength in the laser, has a refractive index different than adjacent layers, and is positioned to form a resonant reflection acting to increase the longitudinal mode intensity in the quantum dot active region and decrease the longitudinal mode intensity in the contact layers.

13. The VCSEL of claim 12, wherein each mode control layer has a refractive index lower than adjacent layers.

14. The VCSEL of claim 13, wherein the active region has a thickness that is approximately an integral number of half wavelengths in the laser.

15. The VCSEL of claim 12, wherein each mode control layer has a refractive index higher than adjacent layers.

16. The VCSEL of claim 15, wherein the active region has a thickness that is approximately an odd number of quarter wavelengths.

17. A vertical cavity surface emitting semiconductor laser (VCSEL), comprising:
    a first distributed bragg reflector (DBR) mirror;
    a second distributed bragg reflector (DBR) mirror spaced apart from the first mirror to form a microcavity for a longitudinal optical mode;
    a semiconductor quantum dot active region having a first end and a second end disposed in the microcavity between the mirrors;
    first and second doped semiconductor intracavity contact layers disposed in the microcavity on opposed ends of the quantum dot active region doped to inject electron-hole pairs into the quantum dot active region in response to a drive current;
    at least one mode control layer disposed in the microcavity;
    the at least one mode control layer having a refractive index profile for generating reflections within the microcavity which create a resonance condition that increases optical confinement in the active region and decreases optical loss in contact layers.

18. The laser of claim 17, wherein each mode control layer is approximately a quarter of a wavelength in thickness and has a refractive index profile different than adjacent layers.

19. The laser of claim 18, wherein each mode control layer is disposed between the active region and a heavily doped portion of a contact layer.

20. The laser of claim 17, wherein at least one of the DBR mirrors is an ultrahigh reflectivity DBR mirror formed by laterally oxidizing DBR mirror pair layers that include an oxidizable semiconductor layer and a substantially non-oxidizable semiconductor layer.

21. The laser of claim 20, further comprising an intermediate composition layer disposed between the oxidizable semiconductor layer and the substantially non-oxidizable semiconductor layer to inhibit delamination.

22. The laser of claim 20, wherein the first mirror is formed into a mesa laterally oxidized along at least one side; and the second mirror has its bottom surface disposed on a substrate layer, the second mirror having at least one cavity disposed through it through which the second mirror is oxidized and at least one connecting section providing lateral support.

23. The laser of claim 21 wherein the laser has a threshold gain less than a saturated gain of a ground state of the quantum dots in a temperature range between about 0° C. and 85° C.

24. A vertical cavity surface emitting laser, comprising:

first and second distributed bragg reflector (DBR) mirror means for forming an optical cavity between the mirror means having optical feedback;

quantum dot active means disposed within the optical cavity for providing optical gain responsive to a current;

intracavity contact layer means for proving current to the quantum dot active means; and resonant mode control layer means disposed between the mirror means for increasing the optical confinement of the quantum dot active means and reducing the optical intensity in the contact layer means.

25. The laser of claim 24, further comprising:

delamination inhibition means for inhibiting the delamination of the high reflectivity mirror means.

26. The laser of claim 24, wherein a threshold gain of the laser is less than a saturated ground state gain over a temperature range between about 0° C. to 85° C.

* * * * *

UNITED STATES PATENT AND TRADEMARK OFFICE
CERTIFICATE OF CORRECTION

PATENT NO. : 6,782,021 B2
DATED : August 24, 2004
INVENTOR(S) : Xiaodong Huang et al.

It is certified that error appears in the above-identified patent and that said Letters Patent is hereby corrected as shown below:

Title page,
Item [56], References Cited, U.S PATENT DOCUMENTS, add:
-- 5,608,229 A    03/1997    Mukai et al.    ....... 257 /14
   5,781,575 A    07/1998    Nilsson         ....... 372 /50
   5,930,278 A    07/1999    Menigaux        ....... 372 /50 --

OTHER PUBLICATIONS, add:
- Komori, Kazuhiro et al., "Noise Study of Low-Dimensional Quantum-Well Semiconductor Laser Amplifiers," *IEEE Journal of Quantum Electronics*, IEEE Inc., New York, US, Vol. 28, No. 9, September 1, 1992, pages 1894-1900.
- Saito, Hideaki et al., "Room-temperature lasing operation of a Quantum-dot vertical-cavity surface-emitting laser," *Applied Physics Letters*, " American Institute of Physics, New York, US, Vol. 69, No. 21, November 18, 1996, pages 3140-3142.
- Utzmeier, T. et al., "Growth and characterization of self-organized InSb quantum dots and quantum dashes," *Journal of Crystal Growth*, North-Holland Publishing Co., Amsterdam, The Netherlands, Vol. 175-176, May 1, 1997, pages 725-729.
- PCT International Search Report, International Application No. PCT/US01/29561, June 6, 2003, 7 pages.
- Bloch, J. et al., "Room-temperature 1.3 µm emission from InAs quantum dots grown by metal organic chemical vapor deposition," *Applied Physics Letters*, American Institute of Physics, New York, U.S., Vol. 75, No. 15, October 11, 1999, pages 2199-2201.
- Evans, P.W. et al., "Edge-emitting quantum well heterostructure laser diodes with auxiliary native-oxide vertical cavity confinement," *Applied Physics Letters*, American Institute of Physics, New York, U.S., Vol. 67, No. 21, November 20, 1995, pages 3168-3170.
- Garcia, J.M. et al., "Electronic states tuning of InAs self-assembled quantum dots," *Applied Physics Letters*, American Institute of Physics, New York, U.S., Vol. 72, No. 24, June 15, 1998, pages 3172-3174.
- Kim, Jin K. et al., "Lateral Carrier Confinement in Miniature Lasers Using Quantum Dots," *IEEE Journal of Selected Topics in Quantum Electronics*, IEEE Service Center, U.S., Vol. 6, No. 3, May/June 2000, pages 504-510.
- Ledentsov N.N. et al., "Interconnection between gain spectrum and cavity mode in a quantum-dot vertical-cavity laser," *Semiconductor Science and Technology*, Institute of Physics, London, G.B., Vol. 14, No. 1, 1999, pages 99-102.
- Park, Gyoungwon et al., "Temperature Dependence of Gain Saturation in Multilevel Quantum Dot Lasers," *IEEE Journal of Quantum Electronics*, IEEE Inc., New York, U.S., Vol. 36, No. 9, September 2000, pages 1065-1071.
- Saito, Hideaki et al., "Controlling polarization of quantum-dot surface-emitting lasers by using structurally anisotropic self-assembled dots," *Applied Physics Letters*, American Institute of Physics, New York, U.S., Vol. 71, No. 5, August 4, 1997, pages 590-592.

UNITED STATES PATENT AND TRADEMARK OFFICE
CERTIFICATE OF CORRECTION

PATENT NO. : 6,782,021 B2
DATED : August 24, 2004
INVENTOR(S) : Xiaodong Huang et al.

It is certified that error appears in the above-identified patent and that said Letters Patent is hereby corrected as shown below:

OTHER PUBLICATIONS (cont.)

Schur, Richard et al., "Vertical Microcavity Lasers with InGasAs/GaAs Quantum Dots Formed by Spinodal Phase Separation," *Japanese Journal of Applied Physics*, Tokyo, Japan, Vol. 36, No. 3B, March 15, 1997, pages 357-360.

Shchekin, Oleg B. et al., "Low-Threshold Continuous-Wave Two-Stack Quantum-Dot Laser with Reduced Temperature Sensitivity," *IEEE Photonics Technology Letters*, IEEE Inc., New York, U.S., Vol. 12, No. 9, September 2000, pages 1120-1122.

Ustinov, V.M. et al., "High output power CW operation of a quantum dot laser," *Compound Semiconductors 1999*, Proceedings of the 26$^{th}$ International Symposium on Compound Semiconductors, Berlin, Germany, August 22-26, 1999, Institute of Physics Conference Series, IOP Publishing Ltd., London, G.B., No. 166, pages 277-280.

PCT International Search Report, International Application No. PCT/US01/31256, May 27, 2003, 7 pages.

PCT International Search Report, International Application No. PCT/US02/06221, May 27, 2003, 4 pages.

Mehuys, D.; Mittelstein, M.; Yariv, A.; Sarfaty, R.; and Ungar, J.E.; *Optimised Fabry-Perot (AIGa)As Quantum-Well Lasers Tunable Over 105nm;* Electronic Letters; Vol. 25, No. 2; January 19, 1989; pp. 143-145.

Mirin, R.; Gossard, A.; and Bowers, J.; *Room Temperature Lasing From InGaAs Quantum Dots*; Electronics Letters; Vol. 32, No. 18; August 29, 1996; pp.1732-1734.

Morton, P.A.; Ackerman, D.A.; Shtengel, G.E.; Kazarinov, R.F.; Hybertsen, M.S.; Tanbun-Ek, T.; Logan, R.A.; and Sergent, A.M.; *Gain Characteristics Of 1.55 μm High Speed Multiple-Quantum-Well Lasers*; IEEE Photonics Technology Letters, Vol. 7, No. 8; August 1995; pp. 833-835.

Mukai, K.; Nakata, Y.; Otsubo, K.; Sugawara, M.; Yokoyama, N.; and Ishikawa, H.; *High Characteristic Temperature Of Near-1.3 μm InGaAs/GaAs Quantum-Dot Lasers;* CLEO 2000 Conference; May 2000 pp. 345-346.

Mukai, K.; Nakata, Y.; Shoji, H.; Sugawara, M.; Ohtsubo, K.; Yokoyama, N.; and Ishikawa, H.; *Lasing With Low Threshold Current And High Output Power From Columnar-Shaped InAs/GaAs Quantum Dots*; Electronics Letters; Vol. 34, No. 16; August 6, 1998, pp. 1588-1590.

Mukai, Kohki; Ohtsuka, Nobuyuki; Shoji, Hajime; and Sugawara, Mitsuru; *Growth And Optical Evaluation Of InGaAs/GaAs Quantum Dots Self-Formed During Alternate Supply Of Precursors*; Applied Surface Science; Vol. 112; March 1997; pp. 102-109.

Mukai, Kohki; Ohtsuka, Nobuyuki; Sugawara, Mitsuru; and Yamazaki; Susumu; *Self-Formed $In_{0.5}Ga_{0.5}As$ Quantum Dots On GaAs Substrates Emitting At 1.3 μm;* Jpn. J. Appl. Phys. Vol. 33, Part 2, No. 12A; December 1, 1994; pp. 1710-1712.

Newell, T.C.; Bossert, D.J.; Stintz, A.; Fuchs, B.; Malloy, K.J.; and Lester, L.F.; *Gain And Linewidth Enhancement Factor In InAs Quantum-Dot Laser Diodes*; IEEE Photonics Technology Letters; Vol. 11, No. 12; December 1999; pp. 1527-1529.

UNITED STATES PATENT AND TRADEMARK OFFICE
CERTIFICATE OF CORRECTION

PATENT NO.    : 6,782,021 B2
DATED         : August 24, 2004
INVENTOR(S)   : Xiaodong Huang et al.

It is certified that error appears in the above-identified patent and that said Letters Patent is hereby corrected as shown below:

OTHER PUBLICATIONS, (cont.)

Newell, T.C.; Li, H.; Eliseev, P.; Liu, G.T.; Stintz, A.; Malloy, K.J.; and Lester, L.F.; *Broadening Mechanisms, Gain, And Low Linewidth Enhancement Factor In InAs Quantum Dot Lasers*; Conference: CLEO 2000; May 2000; p. 363.

Newell, T.C.; Li, H.; Stintz, A.; Bossert, D.; Fuchs, B.; Malloy, K.J.; and Lester, L.F.; *Optical Characteristics And Low Linewidth Enhancement Factor in 1.2 µm Quantum Dot Lasers;* Conference: 1999 IEEE LEOS Annual Meeting Conference Proceedings; LEOS'99; 12th Annual Meeting; IEEE Lasers And Electro-Optics Society 1999 Annual Meeting; November 8-11, 1999.

Newell, T.C.; Varangis, P.; Pease, E.; Liu, G.T.; Stintz, A.; Malloy, K.; and Lester L.F.; *1.5 µm AlGainAs Quantum Well Lasers Grown By The Digital Alloy Technique;* Conference: CLEO 2000; May 2000; pp. 174-175.

Nishi, Kenichi; Saito, Hideaki; and Sugou, Shigeo; *A Narrow Photoluminescence Linewidth of 21 meV at 1.35 µm From Strain-Reduced InAs Quantum Dots Covered By $In_{0.2}Ga_{0.8}As$ Grown On GaAs Substrates*; Applied Physics Letters; Vol. 74, No. 8; February 22, 1999; pp. 1111-1113.

Park, G.; Shchekin, O.B.; Huffaker, D.L.; and Deppe, D.G.; *Very Low Threshold Oxide-Confined 1.3 µm GaAs-Based Quantum Dot Laser;* CLEO 2000 Conference; May 2000; pp. 349-350.

Park, Gyounwon; Shchekin, Oleg B.; Csutak, Sebastian; Huffaker, Diana L.; and Deppe, Dennis G.; *Room-Temperature Continuous-Wave Operation Of A Single-Layered 1.3µm Quantum Dot Laser*; Applied Physics Letters, Vol. 75, No. 21; November 22, 1999; pp. 3267-3269.

Prieto, J.A.; Armelles, G.; Priester, C.; Garcia, J.M.; Gonzalez, L.; and Garcia, R.; *Strain-Induced Optical Anisotropy In Self-Organized Quantum Structures At The $E_1$ Transition*; Applied Physics Letters; Vol. 76, No. 16; April 17, 2000; pp. 2197-2199.

Qiu, Y.; Gogna, P.; Forouhar, S.; Stintz, A.; and Lester, L.F.; *High-Performance InAs Quantum Dot Lasers Near 1.3 µm;* Applied Physics Letters; Vol. 79, Number 22; November 26, 2001; pp. 3570-3572.

Qiu, Y.; Gogna, P.; and Forouhar, S.; *High Temperature Continuous Wave Operation Of InAs Quantum Dot Lasers Near 1.3 µm*; Conference: IEEE Lasers & Electro-Optics Society; LEOS Conference; November 12-16, 2001; pp. 267-268.

Sakaki, Hiroyuki; *Quantum Wires, Quantum Boxes And Related Structures; Physics, Device Potentials And Structural Requirements*; Surface Science; Vol. 267; 1992; pp.623-629.

Shernyakov, Yu.M.; Bedarev, D.A.; Kondrat'eva, E.Yu.; Kop'ev, P.S.; Kovsh; A.R.; Maleev, N.A.; Maximov, M.V.; Mikhrin, S.S.; Tsatsul'nikov, A.F.; Ustinov, V.M.; Volovik, B.V.; Zhukov, A.E.; Alferov, Zh.I.; Ledentsov, N.N.; and Bimberg, D.; *1.3µm GaAs-Based Laser Using Quantum Dots Obtained By Activated Spinodal Decomposition;* Electronics Letters; Vol. 35, No. 11; May 27, 1999; pp. 898-900.

Shoji, H.; Mukai, K.; Ohtsuka, N.; Sugawara, M.; Uchida, T.; and Ishikawa, H.; *Lasing At Three-Dimensionally Quantum-Confined Sublevel Of Self-Organized $In_{0.5}Ga_{0.5}As$ Quantum Dots By Current Injection*; IEEE Photonics Technology Letters, Vol. 7, No. 12; December 1995; pp. 1385-1387.

UNITED STATES PATENT AND TRADEMARK OFFICE
CERTIFICATE OF CORRECTION

PATENT NO. : 6,782,021 B2
DATED : August 24, 2004
INVENTOR(S) : Xiaodong Huang et al.

It is certified that error appears in the above-identified patent and that said Letters Patent is hereby corrected as shown below:

OTHER PUBLICATIONS, (cont.)

Stintz, A.; Liu, G.T.; Gray, A.L.; Spillers, R.; Delgado, S.M.; and Malloy, K.J.; *Characterization Of InAs Quantum Dots In Strained $In_xGa_{1-x}As$ Quantum Wells*; J.Vac.Sci.Technol.; Vol. B 18(3); May/Jun 2000; pp.1496-1501.

Stintz, A.; Liu, G.T.; Li, H.; Lester, L.F.; and Malloy, K.J.; *Low-Threshold Current Density 1.3-µm InAs Quantum-Dot Lasers With The Dots-In-A-Well (DWELL) Structure*; IEEE Photonics Technology Letters; Vol. 12, No. 6; June 2000; pp. 591-593.

Tabuchi, H.; and Ishikawa H.; *External Grating Tunable MQW Laser With Wide Tuning Range Of 240nm*; Electronic Letters; Vol. 26, No. 11; May 24, 1990; pp. 742-743.

Thomson, J.D.; Herrmann, E.; Summers, H.D.; Smowton, P.M.; and Hopkinson, M.; *Temperature Insensitive Quantum Dot Structures For Vertical Cavity Lasers*; CLEO 2000 Conference; May 2000; pp. 347-348.

Ustinov, V.M.; Maleev, N.A.; Zhukov, A.E.; Kovsh, A.R.; Egorov, A.Yu.; Lunev, A.V.; Volovik, B.V.; Krestnikov, I.L.; Musikhin, Yu.G.; Bert, N.A.; Kop'ev, P.S.; and Alferov, Zh.I.; *InAs/InGaAs Quantum Dot Structures On GaAs Substrates Emitting at 1.3µm*; Applied Physics Letters; Vol. 74, No. 19; May 10, 1999; pp. 2815-2817.

Varangis, P.M.; Li, H.; Liu, G.T.; Newell, T.C.; Stintz, A.; Fuchs, B.; Malloy, K.J.; and Lester, L.F.; *Low-Threshold Quantum Dot Lasers With 201nm Tuning Range*; Electronics Letters; Vol. 36, No. 18; August 31, 2000.

Varangis, P.M.; Li, H.; Liu, G.T.; Newell, T.C.; Stintz, A.; Fuchs, B.; Malloy, K.J.; and Lester, L.F.; *183 nm Tuning Range In A Grating-Coupled External-Cavity Quantum Dot Laser*; IEEE 2000 International Semiconductor Laser Conference; pp. 137-138.

Wang, R.H.; Stintz, A.; Rotter, T.J.; Malloy, K.J.; and Lester, L.F.; *Low Threshold Oxide-Confined InAs Quantum Dash Ridge Waveguide Lasers On InP Substrates*; Conference: IEEE Lasers & Electro-Optics Society; LEOS Conference; November 12-16, 2001; pp. 405-406.

Wang, R.H.; Stintz, A.; Varangis, P.M.; Newell, T.C.; Li, H.; Malloy, K.J.; and Lester, L.F.; *Room-Temperature Operation Of InAs Quantum-Dash Lasers On InP (001)*; IEEE Photonics Technology Letters; Vol. 13, No. 8; August 2001; pp. 767-769.

Wang, Ronghua; Stintz, A.; Varangis, P.M.; Newell, T.C.; Li, H.; Lester, L.F.; and Malloy, K.J.; *1.6 µm Single And Multiple-Stack Room Temperature Quantum Dash Lasers On InP*; Conference: CLEO (Conference On Lasers And Electro Optics)/QELS Plenary Session And Awards Ceremony; May 9, 2001.

Wang, Zhanguo; Liu, Fengqi; Liang, Jiben; and Xu, Bo; *Self-Assembled InAs/GaAs Quantum Dots And Quantum Dot Laser*; Science in China; Vol. 43, No. 8; August 2000; pp. 861-870.

Wasilewski, Z.R.; Fafard, S.; and McCaffrey J.P.; *Size And Shape Engineering Of Vertically Stacked Self-Assembled Quantum Dots*; Journal Of Crystal Growth; Vol. 201, 202; 1999; pp. 1131-1135.

UNITED STATES PATENT AND TRADEMARK OFFICE
CERTIFICATE OF CORRECTION

PATENT NO. : 6,782,021 B2
DATED : August 24, 2004
INVENTOR(S) : Xiaodong Huang et al.

It is certified that error appears in the above-identified patent and that said Letters Patent is hereby corrected as shown below:

OTHER PUBLICATIONS, (cont.)

Willatzen, M.; Tanaka, T.; Arakawa, Y.; and Singh, J.; *Polarization Dependence Of Optoelectronic Properties In Quantum Dots And Quantum Wires – Consequences Of Valence-Band Mixing*; IEEE Journal of Quantum Eletronics; Vol. 30, No. 3; March 1994; pp. 640-653.

Zhukov, A.E.; Kovsh, A.R.; Egorov, A.Yu.; Maleev, N.A., Ustinov, V.M.; Volovik, B.V.; Maksimov, M.V.; Tsatsul'nikov, A.F.; Ledenstov, N.N.; . Shernyakov, Yu.M.; Lunev, A.V., Musikhin, Yu.G.; Bert, N.A.; Kop'ev, P.S.; and Alferov, Zh.I.; *Photo And Electoluminescence In The 1.3 μm Wavelength Range From Quantum-Dot Structures Grown On GaAs Substrates;* Semiconductors; Vol. 33, No. 2; February 1999; pp. 153-156.

Signed and Sealed this

Fourth Day of January, 2005

JON W. DUDAS
*Director of the United States Patent and Trademark Office*